United States Patent
Chahal et al.

(10) Patent No.: US 9,960,037 B2
(45) Date of Patent: May 1, 2018

(54) LASER ASSISTED SIC GROWTH ON SILICON

(71) Applicant: Board of Trustees of Michigan State University, East Lansing, MI (US)

(72) Inventors: Premjeet Chahal, Okemos, MI (US); Tim Hogan, East Lansing, MI (US); Amanpreet Kaur, Okemos, MI (US)

(73) Assignee: Board Of Trustees Of Michigan State University, East Lansing, MI (US)

( * ) Notice: Subject to any disclaimer, the term of this patent is extended or adjusted under 35 U.S.C. 154(b) by 0 days. days.

(21) Appl. No.: 15/227,216

(22) Filed: Aug. 3, 2016

(65) Prior Publication Data
US 2017/0040167 A1 Feb. 9, 2017

Related U.S. Application Data

(60) Provisional application No. 62/200,302, filed on Aug. 3, 2015.

(51) Int. Cl.
*H01L 21/02* (2006.01)
*H01L 31/18* (2006.01)
*H01L 31/065* (2012.01)
*H01L 31/0745* (2012.01)

(52) U.S. Cl.
CPC .. *H01L 21/02529* (2013.01); *H01L 21/02118* (2013.01); *H01L 21/02345* (2013.01); *H01L 21/02381* (2013.01); *H01L 21/02658* (2013.01); *H01L 21/02667* (2013.01); *H01L 21/02686* (2013.01); *H01L 21/02689* (2013.01); *H01L 31/065* (2013.01); *H01L 31/0745* (2013.01); *H01L 31/1812* (2013.01); *Y02E 10/50* (2013.01)

(58) Field of Classification Search
None
See application file for complete search history.

(56) References Cited

U.S. PATENT DOCUMENTS

| | | | | | |
|---|---|---|---|---|---|
| 5,360,491 | A | * | 11/1994 | Carey | H01L 31/02168 136/256 |
| 5,425,860 | A | * | 6/1995 | Truher | C23C 14/0635 136/258 |
| 8,617,669 | B1 | * | 12/2013 | Quick | H01L 21/02381 427/248.1 |
| 2008/0076238 | A1 | * | 3/2008 | Miyashita | H01L 29/41766 438/527 |
| 2014/0346531 | A1 | * | 11/2014 | Imai | H01L 29/872 257/77 |

OTHER PUBLICATIONS

A. Kaur et al. Selective Fabrication of SiC/Si Diodes by Excimer Laser Under Ambient Conditions. Feb. 2016. IEEE Electron Device Letters, vol. 37. No. 2.*

* cited by examiner

*Primary Examiner* — Hoang-Quan Ho
(74) *Attorney, Agent, or Firm* — Harness, Dickey & Pierce, PLC

(57) ABSTRACT

A method for forming a compound on a substrate is provided. The method includes depositing a composition onto a surface of a substrate; illuminating the composition and the substrate with pulsed energy; melting the substrate and decomposing the composition simultaneously; and forming a compound on the substrate. A first component of the compound is derived from the substrate and a second component of the compound is derived from the composition.

18 Claims, 18 Drawing Sheets

LASER ASSISTED SIC GROWTH ON SILICON

CROSS-REFERENCE TO RELATED APPLICATIONS

This application claims the benefit of U.S. Provisional Application No. 62/200,302, filed Aug. 3, 2015. The entire disclosure of the above application is incorporated herein by reference.

GOVERNMENT RIGHTS

This invention was made with government support under N66001-12-1-4238 awarded by the U.S. Defense Advanced Research Projects Agency. The government has certain rights in the invention.

FIELD

The present disclosure relates to methods for making heterojunctions for photovoltaic and other optical devices, and high power and high frequency devices.

BACKGROUND

This section provides background information related to the present disclosure which is not necessarily prior art.

According to a United Nations (UN) report, with current energy usage (largely based on fossil fuels), the Earth's temperature will rise between 1.5 to 4° C. over the next 50 years due to greenhouse gases. With this rise in temperature, Earth faces a future of extreme weather, rising sea levels and melting polar ice from soaring levels of carbon dioxide, methane and other greenhouse gases. A global effort in green manufacturing and use of renewable energy resources is necessary to reduce emission to prevent temperatures from rising; preventing catastrophic and dangerous disruptions worldwide. In parallel to this challenge, a quarter of the world's population (roughly 1.6 billion) has no electricity. Lack of availability of electricity has a direct correlation to poverty and poor health. The current approach of transporting energy to remote locations is difficult and expensive. Thus, production of energy from local resources is necessary. Use of photovoltaics (solar cells) and their manufacturing play an important role in the improvement of environment and society.

Photovoltaic (PV) devices directly convert sunlight into electricity. On average, the sun illuminates the Earth with more than 10,000 times the light energy humans currently consume, PVs have the potential to be a large and environmental friendly energy source. The production cost of solar electricity has reduced over the last decade and can now compete with grid electricity. This increase is driven by advances in PV technology, large scale manufacturing, and also because the relative cost of oil and coal has increased over the last decade. Crystalline silicon (c-Si) based PVs currently dominate the market due to their large efficiency and low cost of production. This domination is also largely because Si is available in abundance, it is non-toxic and it is stable under harsh environment conditions. Further advances in this technology are needed to make it compatible with green manufacturing, achieve higher efficiency and to reduce overall cost.

One of the biggest obstacles to harvesting renewable energy sources is cost. Many approaches to harvesting solar energy are being explored by the scientific community (e.g., solar cells, thermal concentrators, etc.). Among the many viable approaches, solar cells are attractive as they provide direct conversion from light to electric energy. Both organic and inorganic materials are being explored for the design of high efficiency low-cost solar cells. Organic solar cells, although having the potential to reduce cost, still suffer from long term stability. Inorganic materials for solar cell production, the most commonly used being Gallium Arsenide (GaAs), silicon (Si), Indium Phosphide (InP), and cadmium telluride, have shown to have long term stability while still maintaining the potential to reduce cost. Reducing the cost of producing solar electricity plays an important role in spreading its use as a clean and renewable energy source. The cost to manufacture solar cells can be reduced in two ways, by increasing their efficiency and by developing low-cost production technologies. Among these device technologies, silicon (Si) devices are attractive as the base material. Silicon is available in abundance in nature and thin-films of Si can be deposited using a variety of techniques, such as e-beam, plasma enhanced chemical vapor deposition, and pulsed laser deposition. Silicon based technologies provide an optimum balance between material cost, efficiency and product life time.

The reason Si solar cells have not become popular in daily life is because existing solar cell processes are very elaborate and require expensive fabrication steps. The number of mask steps required to fabricate solar cells can be large and minimizing these steps is necessary to reduce cost. Furthermore, for high efficiency solar cell technologies, the cost associated with the manufacture of Si wafers is high due to required chemical and mechanical polishing. Among the many types of solar cell device technologies, silicon heterojunction (SHJ) solar cells have become popular due to their large efficiencies and ability to process at low temperatures at reduced cost. FIG. 1 shows a cross sectional diagram of a SHJ solar cell. The SHJ consists of thin hydrogenated amorphous silicon (a-Si:H) wide bandgap buffer layers deposited on crystalline silicone (c-Si) wafers. These hydrogenated buffer layers (a-Si:H) help improve the quality of the material and provide a higher bandgap layer. A transparent conductive oxide (TCO) layer is deposited on the highly doped a-Si:H layers. Top and bottom electrode layers are screen printed. This design enables energy conversion efficiency above 20% at the production level. The key feature of this technology is that the metal contacts, which have a highly recombination active interface, are separated from the absorption region by utilizing wide bandgap a-Si:H layers. This enables high open-circuit voltages typically associated with heterojunction devices. Pyramid structures (5-10 μm) are included to enhance capture of incoming light (anti-reflection, AR, layer). The heterojunction solar cells are also utilized to enhance the absorption of a wider optical spectrum. The efficiency of Si solar cells increases by growing a top layer of a semiconductor (a-Si:H) with an energy bandgap larger than the c-Si layer. Incident photons with energy greater than the bandgap energy of a-Si:H will be absorbed in this top layer. Photons of lower energy will be absorbed in the c-Si layer to form carrier pairs. In this way, more of the energy of the solar spectrum is used to generate electrical power.

From a processing point of view, the key advantages of SHJ technology is that thin Si wafers can be used and an overall fewer number of fabrication steps are required compared to other Si based devices. The pyramidal texture is formed using a mixture of potassium hydroxide (KOH) and isopropyl alcohol (IPA) solutions at an elevated temperature. Texturing helps by lowering external optical reflection, and in parallel, improves internal reflection, which improves light trapping. Such texturing can be formed on polished single-crystal silicon, though in recent years methods of forming them on multi-crystalline silicon have been developed. The a-Si:H layers are deposited in vacuum using chemical vapor deposition using silane gas. Prior to the deposition of a-Si:H layers, the c-Si is cleaned to minimize interfacial defects. Oxide and nitride layers are deposited to passivate the surface as a passivation layer. This passivation layer is patterned prior to screen printing conductive electrodes on both sides. Although the above solar cell design minimizes many process steps compared to conventional silicon solar cells while achieving high efficiency, the expensive steps remaining are the substrate material (c-Si), vacuum deposition of a-Si:H layers, and wet etching of textured surface. Thus, there is a need to develop a manufacturing process that: i) avoids the use of vacuum deposition, ii) does not require polished Si substrates, iii) avoids the use of corrosive chemicals to achieve antireflection (AR) texturing, and iv) further enhances conversion efficiency. Here, a silicon carbide (SiC) based heterojunction device processed using a laser as an approach to meet the above challenges is provided.

SUMMARY

This section provides a general summary of the disclosure, and is not a comprehensive disclosure of its full scope or all of its features.

The present technology provides a method for forming a compound on a substrate is provided. The method includes depositing a composition onto a surface of a substrate; illuminating the composition and the substrate with pulsed energy; melting the substrate and decomposing the composition simultaneously; and forming a compound on the substrate. A first component of the compound is derived from the substrate and a second component of the compound is derived from the composition.

The present technology also provides a method for forming SiC on a silicon substrate. The method includes depositing a carbon source on a surface of a Si substrate; illuminating the carbon source and Si with an excimer laser that generates from about 200 mJ to about 1000 mJ of energy with pulses of from about 20 ns to about 1000 ns; moving the excimer laser relative to the Si substrate and carbon source; and forming SiC on the Si substrate. Fabrication can take place on any type of Si substrate, including polished, non-polished, amorphous, powder coated, and pre-processed wafers.

Also, the present technology provides a heterojunction device. The heterojunction device includes a Si substrate and a film of SiC deposited on a surface of the Si substrate. The SiC has a Si:C ratio that increases or decreases from a SiC surface in contact with the Si substrate to an opposing SiC surface that is not in contact with the Si substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 14:
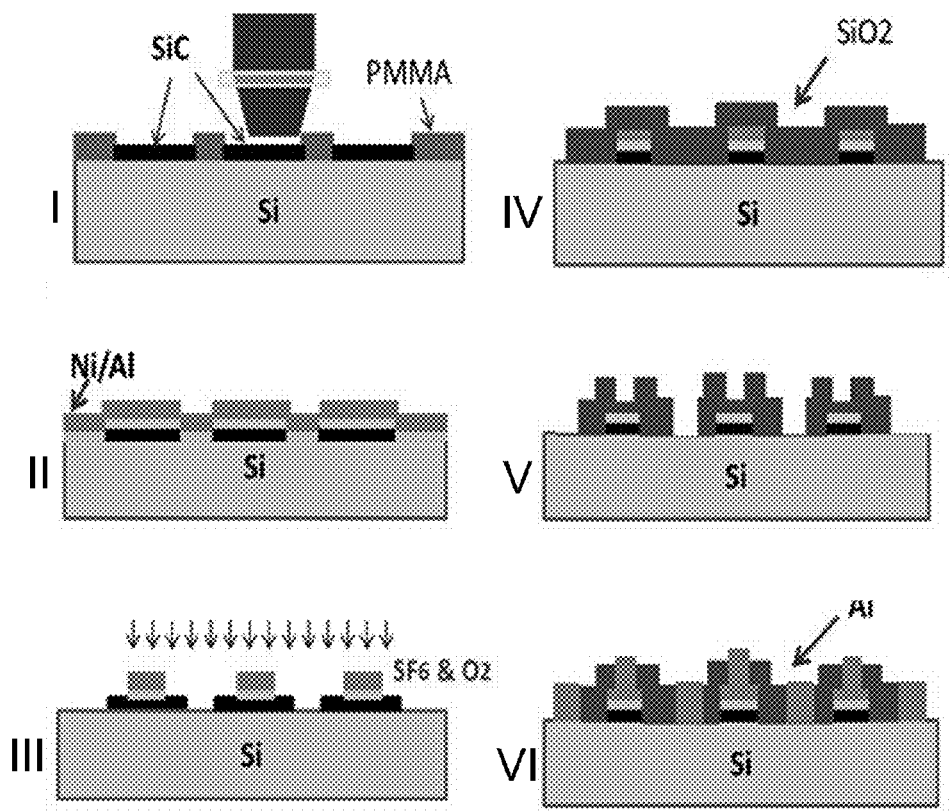
Figure 15:
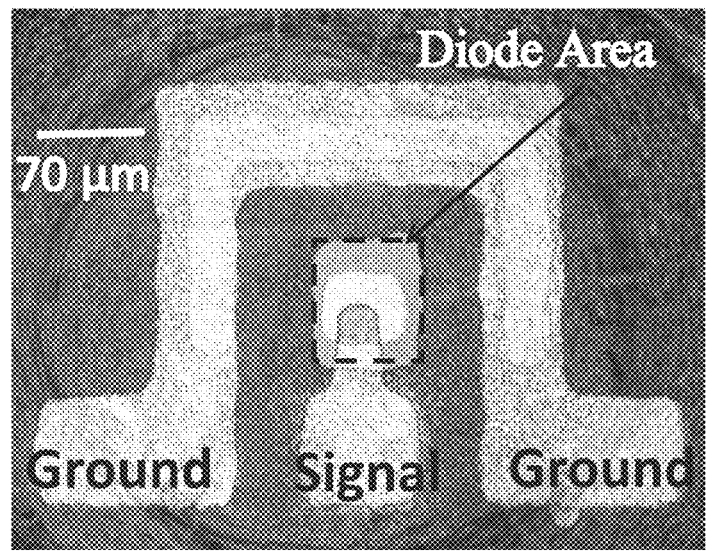
Figure 16:
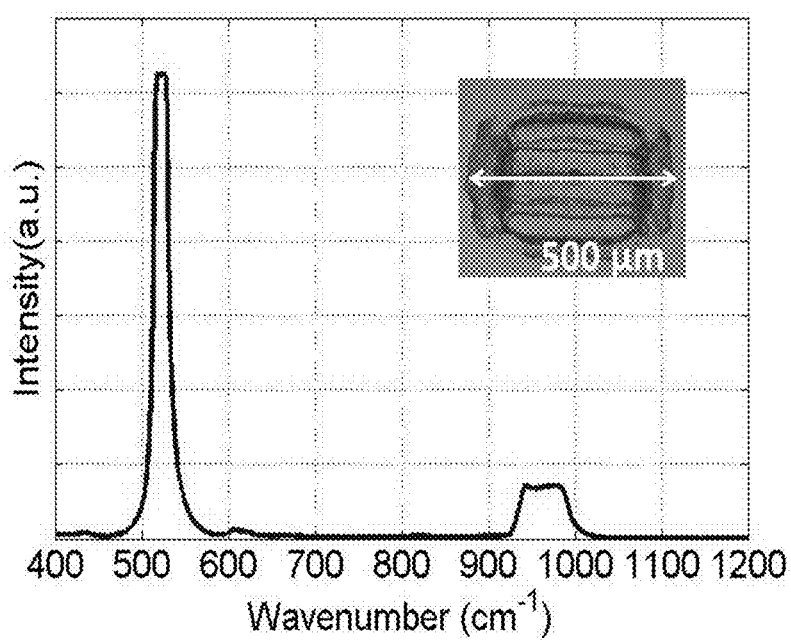
Figure 17:
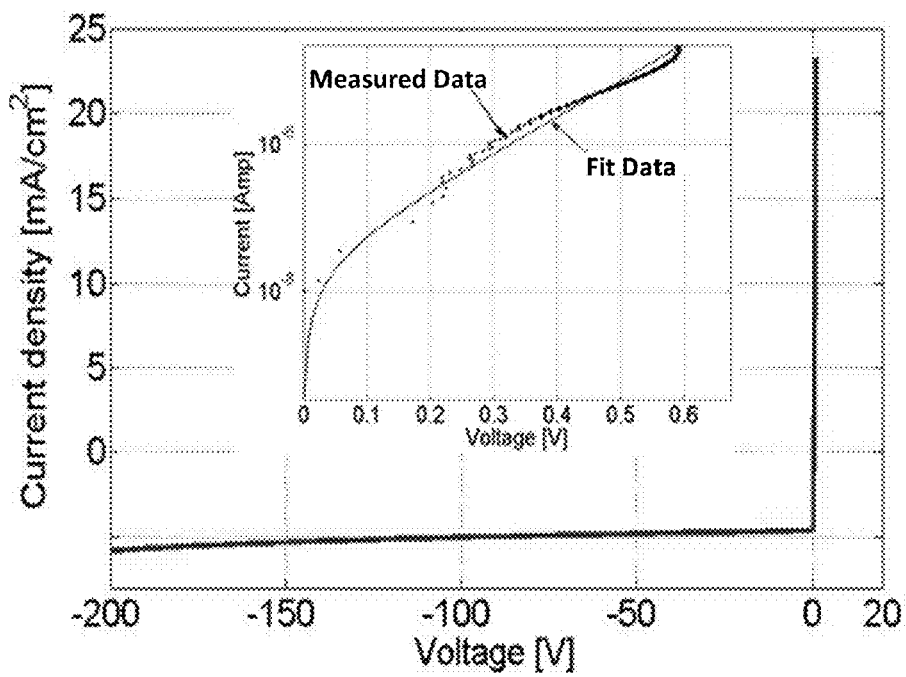
Figure 18:
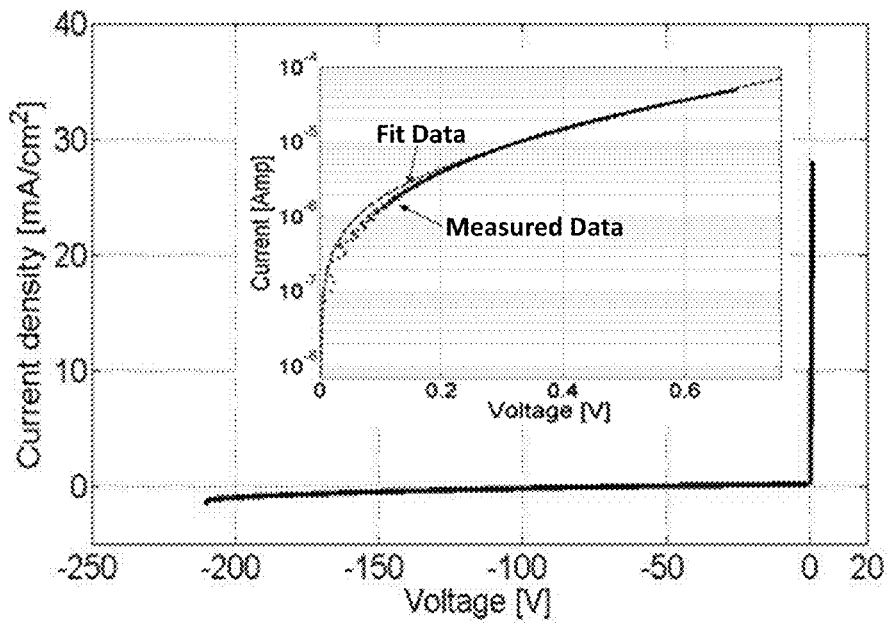
Figure 19:
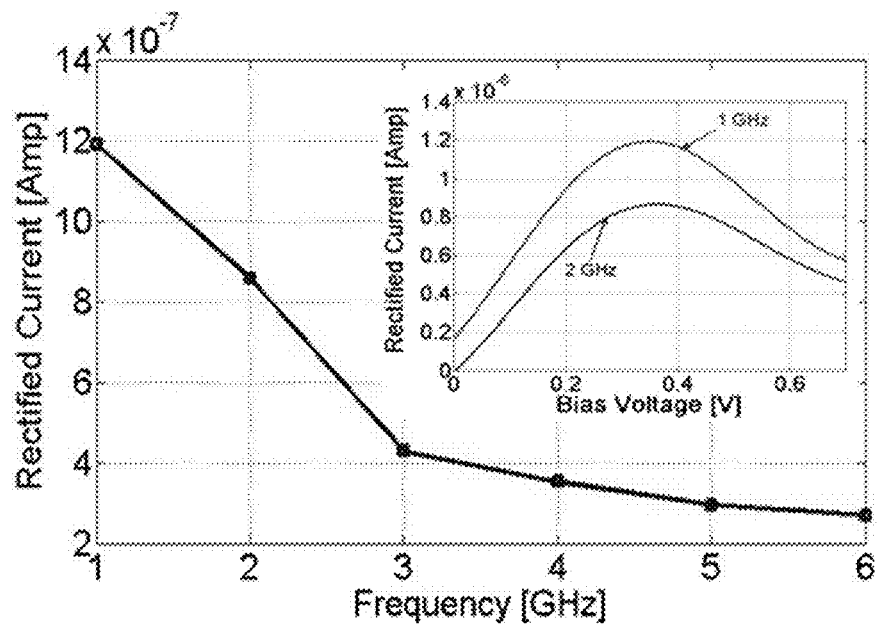
Figure 20:
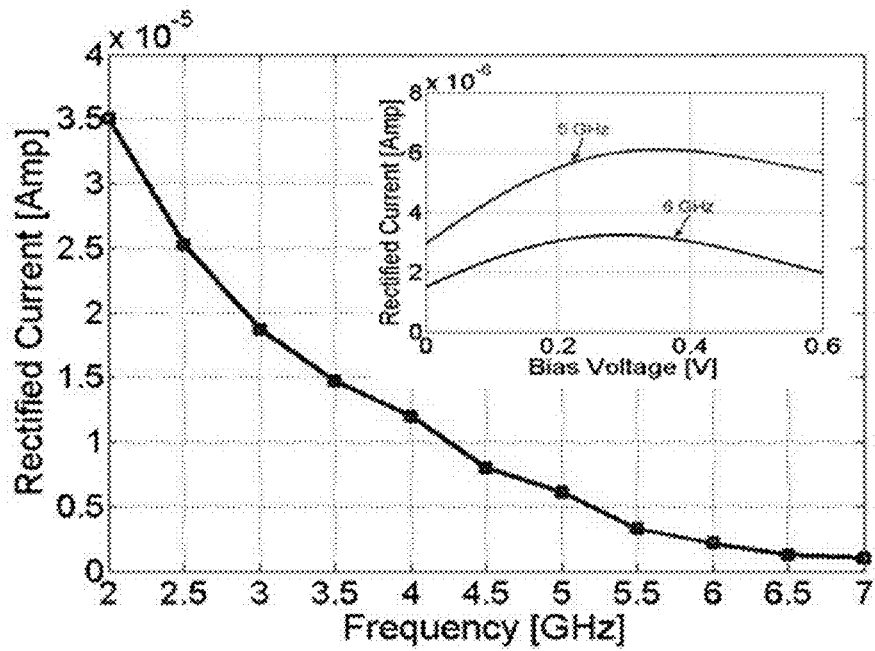
Figure 21:
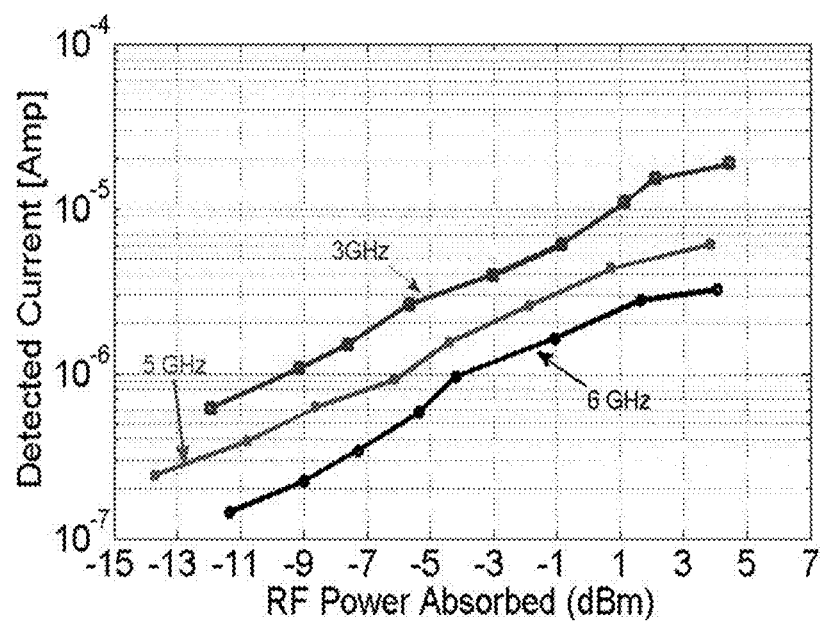
Figure 22:
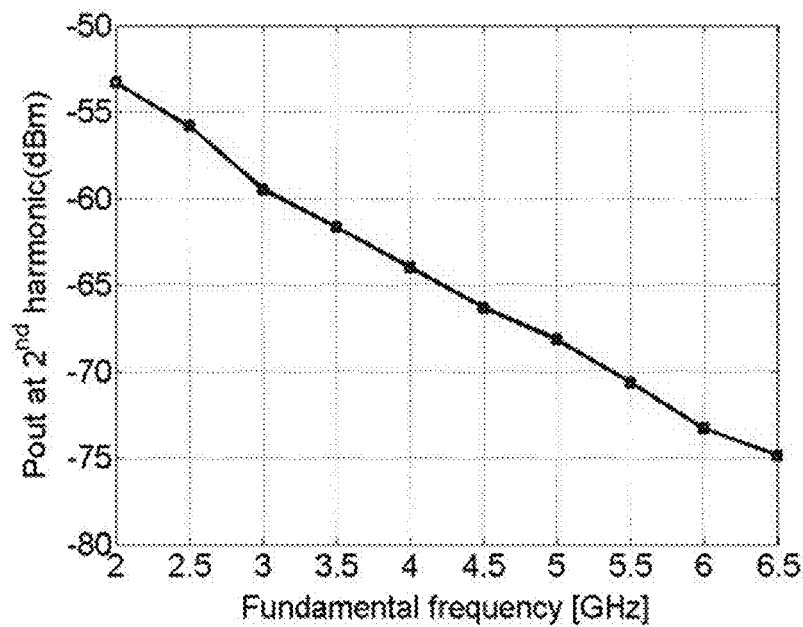
Figure 23:
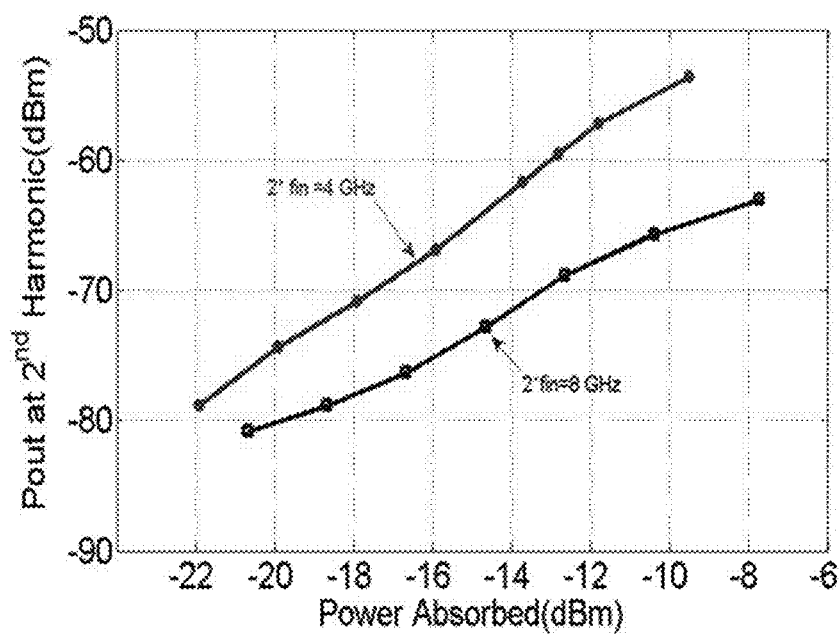

FIG. 14 is a schematic illustration of fabrication steps for SiC/Si diodes for radio frequency (RF) circuits, wherein panel I shows growth of SiC using an excimer laser, panel II shows a first metal layer (Ni/Al) coating, panel III shows Ni/Al patterning and SiC plasma etching, panel IV shows plasma enhanced chemical vapor deposition (PECVD) of SiO$_2$, panel V shows etching oxide using buffer oxide etch (BOE) (1:6), and panel VI shows top Al deposition and patterning;

FIG. 15 is an optical micrograph of a fabricated coplanar waveguide (CPW) structure with a SiC/Si diode;

FIG. 16 is a graph showing measured Raman spectra of SiC/Si for a device made with 2 laser pulses, wherein the optical image of the fabricated device is provided inset;

FIG. 17 is a graph showing measured J-V characteristics of SiC/Si based diodes (Type A) fabricated on low doped wafer, wherein the inset shows a curve fit to a diode equation;

FIG. 18 is a graph showing measured J-V characteristics of SiC/Si based diodes (Type B) fabricated on a high doped wafer, wherein the inset shows a curve fit to a diode equation;

FIG. 19 is a graph of rectified current versus input signal frequency for SiC/Si radio frequency (RF) diodes made on low doped wafers (diode type A) and at a fixed bias of about 0.35 V and RF power of about 4 dBm, wherein the inset shows rectified output signal as a function of DC bias at 5 and 6 GHz and of about 4 dBm input RF power;

FIG. 20 is a graph of Rectified current vs input signal frequency for SiC/Si RF diodes made on high doped wafers (diode type B) and at a fixed bias of about 0.35 V and RF power of about 4 dBm, wherein the inset shows rectified output signal as a function of DC bias at 5 and 6 GHz and of about 4 dBm input RF power;

FIG. 21 is a graph showing measured rectified current at fixed bias (0.35 V) versus input power for SiC/Si radio frequency (RF) diodes at 3, 5 and 6 GHz;

FIG. 22 is a graph showing measured output power of second harmonic versus fundamental frequency of a SiC/Si (type II) diode at an input power of approximately −3 dBm; and FIG. 23 is a graph showing measured output power of second harmonic for SiC/Si at fundamental frequencies of 2 and 4 GHz.

Corresponding reference numerals indicate corresponding parts throughout the several views of the drawings.

DETAILED DESCRIPTION

Example embodiments will now be described more fully with reference to the accompanying drawings.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters.

As referred to herein, ranges are, unless specified otherwise, inclusive of endpoints and include disclosure of all distinct values and further divided ranges within the entire range. Thus, for example, a range of "from A to B" or "from about A to about B" is inclusive of A and of B. Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The current technology provides apparatuses and methods directed to photovoltaic devices, light harvesting systems, and microwave circuits. The methods avoid the use of vacuum deposition, do not require polished Si substrates, avoid the use of corrosive chemicals to achieve AR texturing, and further enhance conversion efficiency. In various embodiments, the methods include depositing a composition onto a surface of a substrate, illuminating the composition and the substrate with a pulsed energy source, melting the substrate and decomposing the composition, and forming a compound on the substrate. A first component of the compound is derived from the substrate and a second component of the compound is derived from the composition.

From a manufacturing point of view, the current method avoids the expensive steps typically used in the fabrication of Si solar cells, diodes, etc. Overall, the energy and material costs required to fabricate devices according to the method are very low. The moderate energy and material demand for the fabrication of the solar cells, diodes, etc. will lead to short energy payback times. Advantages associated with the current method include: i) solar cells, diodes, etc. can be fabricated at atmospheric pressure (without resorting to a high-cost vacuum process as conventionally used) using an excimer laser process; ii) solar cells, diodes, etc. can be fabricated on as-cut unpolished low-cost Si wafers; iii) energy bandgap tailored SiC can be directly formed on Si layer through laser processing; iv) during a laser sintering of the current method, the surface can also be textured to enhance light trapping; and v) carbon interconnect layers can be formed using the same laser setup required by the method through pyrolysis by lowering the laser power where interconnects need to be formed.

Beyond the above advantage points, the process can further be advanced to grow a thin Si layer directly from Si powder on conductive flex substrates (e.g., steel foil) prior to the formation of a SiC layer. The process is versatile and allows the growth of solar cells or diodes on 3D structures.

Apart from solar-cells, Si-SiC devices fabricated by the methods provided herein hold significant potential in a range of other devices, such as, for example, low-cost photodetectors, high-voltage converters, high power high frequency devices, high temperature circuits, optical diodes, water splitting, and others. The proposed technique also holds significant importance for many commercial and military applications by allowing the growth of solar-cells on 3D structures such as helmets, structures of a car, side panels of houses, and housing of hand-held electronic units. SiC is an excellent material for these applications due to its wide bandgap, high thermal conductivity, high electron mobility, and chemical stability.

Figure 1:
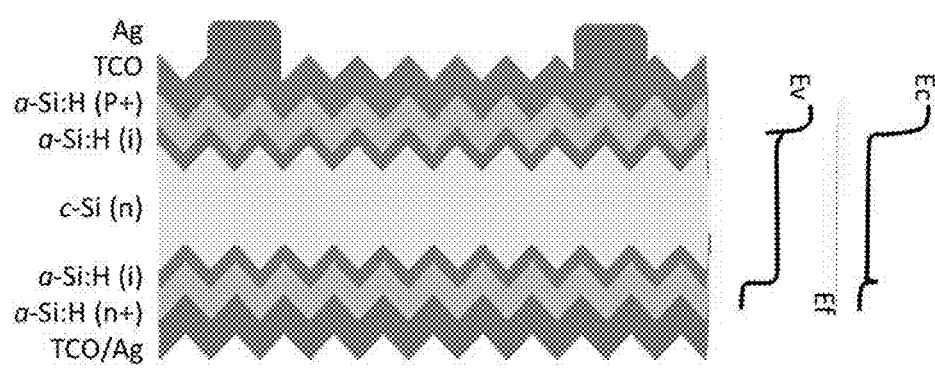
FIG. 1 is a schematic illustration of a silicon heterojunction cell along with a band diagram.

There has been a steady growing interest in wide bandgap silicon carbide (SiC) films for solar cell applications. SiC has a long history and it has been commonly used as an abrasive material for over a century, and more recently in optical devices such as LEDs, lasers and photodetectors as well as high voltage high power devices. Similar to Si, it is an indirect gap semiconductor with a forbidden bandgap ($E_g$) in the range of $2.38<E_g<3.26$ eV (depending on the polytype). It can be converted into a direct bandgap by substituting carbon (C) with germanium (Ge) or nitrogen (N) atoms and has excellent chemical resistant properties to acids and bases. The native oxide of SiC is $SiO_2$, which is important in the growth of electronic devices. It is commonly deposited using chemical vapor deposition (CVD) largely on Si substrates. Also, there has been a great amount of work done on the growth of SiC from crystalline Si through reaction with hydrocarbons at elevated temperatures under vacuum. Some of these processes have been adopted in the fabrication of SiC solar cells. Similar to the structure of FIG. 1, c-Si solar cell with a hydrogenated amorphous silicon carbide (a-SiC:H) buffer layer in place of a-Si:H buffer layers has been demonstrated while achieving solar cells with efficiency near 20%. Here again, CVD was used to grow an a-SiC:H layer and the remaining process steps are the same as the SHJ device discussed above. Thus, from a manufacturing point of view, the benefit gained by using CVD grown a-SiC:H is not significant. However, if growth of SiC can take place at atmospheric pressure and through the use of simple fabrication steps then SiC holds potential for low cost solar cell applications. Here we propose the formation of a SiC buffer layer using an excimer laser which can void the use of the CVD process and while also providing other benefits as discussed later which can help reduce the overall cost of manufacturing heterojunction solar cells. First, a brief background on excimer lasers is given.

Excimer Lasers

Excimer lasers are pulsed gas discharge lasers. They generate optical output in the ultraviolet region of the spectrum. Excimer lasers typically operate at a wavelengths of 193 nm (ArF gas, 6.4 eV), 248 nm (KrF gas, 5.0 eV), 308 nm (XeCl gas, 4.0 eV), or 351 nm (XeF). Excimer lasers are highly precise and are commonly used in eye surgery, photolithography, deposition of materials, and micromachining. These lasers have been used to transform thin layers of amorphous Si (50-100 nm) into high quality polycrystalline Si, with enhanced electron mobility, for use in flat-panel displays for mobile phones and flat-screen televisions. The advantage of using a laser in the annealing and sintering of Si is that energy can be transferred efficiently over a localized area with high resolution, and thin low cost substrates can be used. Excimer lasers are also commonly employed in the deposition of thin films, including Si. The output power, reliability, duty cycle of pulses and wavelength purity have been greatly enhanced over the last two decades and thus have found great reception in the manufacturing industry. Not only used for fine resolution processing, excimer lasers have been utilized in large-area fabrication and annealing of thin films by expanding the beam through optics. The benefit of excimer lasers lies in the surface processing of thin films which is necessary in the fabrication of low-cost, highly efficient solar cells, diodes, etc. The use of laser based technique offer several advantages, such as limited damage of substrates, high quality films due to heating of a small area, spatial resolution, simultaneous synthesis and patterning, low-cost atmospheric pressure processing, fabrication within localized regions, and built-in surface texturing for photovoltaic application.

Methods

Figure 2:
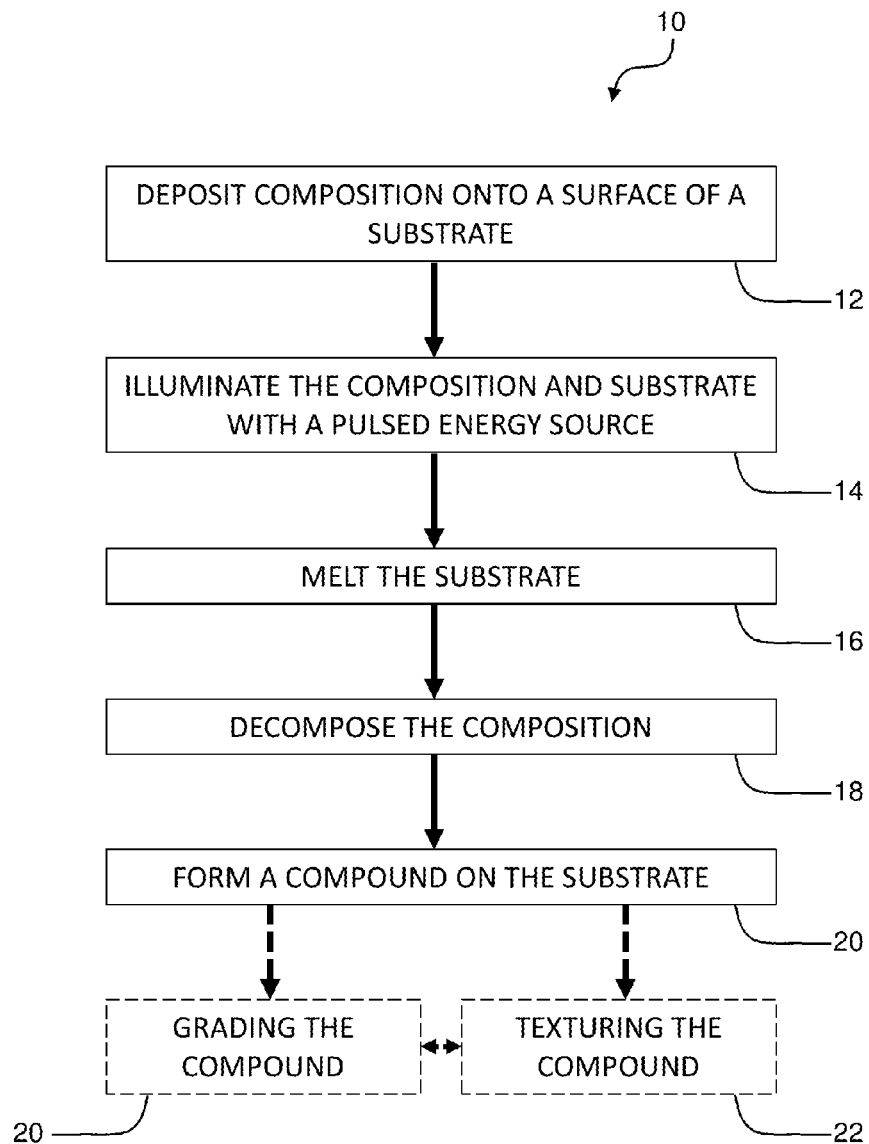
FIG. 2 is a diagram showing a method for forming a compound on a substrate according to the present technology.

With reference to FIG. 2, the current technology provides a method 10 for forming a compound on a substrate, which can be used electronic devices, such as, for example, solar cells (photovoltaics), light emitting diodes (LEDs), high power devices, devices requires high frequencies, optical devices, photodetectors, photometers, etc. As shown in block 12, the method 10 includes depositing a composition onto a surface of a substrate. Depositing can be performed by any means known in the art, such as, for example, spin coating, pouring, brushing, or dipping. The substrate can be any substrate whose surface can withstand high temperatures of from about 800° C. to about 1800° C. and that contains a first component that is to be incorporated into the compound. Therefore, the substrate is a source of the first component. The substrate can be flat, curved, cylindrical, convex, concave, or otherwise three-dimensionally contoured. Additionally, the substrate can be crystalline or amorphous, flexible or inflexible, solid, or in powder form. In various embodiments, the substrate comprises silicon, crystalline silicon, amorphous silicon, silicon wafer, or other silicon coated materials. In some embodiments, the substrate is a powder that is coated onto another material. For example, a substrate powder, such as, for example, Si powder, can be spray coated onto a "sub-substrate" comprising steel, stainless steel, steel flex (foil), or other material.

The composition that is deposited onto a surface of the substrate can be any composition that contains a second component that is to be incorporated into the compound. Therefore, the composition is a source of the second component. The composition is deposited as a thin layer of from about 0.1 μm to about 10 μm, or from about 0.5 μm to about 5 μm. In various embodiments, the composition is a carbon source, such as a carbon-based polymer that may undergo pyrolysis. Non-limiting examples of suitable carbon-based materials include polymers, such as poly(methyl acrylate) (PMA), poly(methyl methacrylate) (PMMA), polyimides, direct carbon sources, such as graphene and graphite, liquid materials, such as carbon rich oils and carbon based gases, and combinations thereof. In various embodiments, after depositing the composition, the substrate and composition may be baked for from about 10 seconds to about 5 minutes at from about 100° C. to about 250° C. During the method 10, the first component and the second component react to form the compound. In one embodiment, the composition comprises a liquid material, such as organic oils, into which the substrate is submerged. Here, a continuous carbon source is provided during multiple pulse illuminations as provided below.

As shown in box 14, the method 10 also includes illuminating the composition and the substrate with pulsed energy emitted from a pulsed energy/heat source. The pulsed energy source can be any pulsed energy source known in the art that focuses heat on the composition and substrate by radiating waves or particles. In some embodiments, the pulsed energy source generates from about 10 pJ to about 1000 mJ, or from about 1 mJ to about 1000 mJ, or from about 10 mJ to about 500 mJ of energy, pulses of from about 10 ns to about 1000 ns, from about 10 ns to about 100 ns, or from about 20 ns to about 30 ns, and a repetition rate of about 100 Hz, about 50 Hz, about 20 Hz, about 10 Hz, or less than about 10 Hz. In one embodiment, the pulsed energy source generates from about 200 mJ to about 1000 mJ, with 25 ns pulses, and a repetition rate of from about 1 Hz to about 100 Hz. Non-limiting examples of pulsed energy sources include excimer lasers, plasma arc melting (PAM), and pulsed particle beams. Excimer lasers include lasers comprising $Ar_2$ (126 nm), $Kr_2$ (146 nm), $F_2$ (157 nm), $Xe_2$ (172 and 175 nm), ArF (193 nm), KrF (248 nm), XeBr (282 nm), XeCl (308 nm), XeF (351 nm), KrCl (222 nm). Pulsed particle beams include pulsed linear particle accelerators (linac's), such as pulsed linac ion accelerators, pulsed linac proton accelerators, pulsed linac electron accelerators, and electron-beam sintering machines.

In various aspects, illuminating the composition and the substrate comprises moving the pulsed energy source relative to the substrate and composition or moving the substrate and composition relative to the pulsed energy source, such that the compound will only be formed in regions that are directly exposed to the pulsed energy. Accordingly, as shown in boxes 16 and 18 the method 10 also respectively includes melting the substrate and decomposing the composition. Because melting and decomposing result from exposure to the pulsed energy source, they may occur simultaneously or substantially simultaneously. More particularly, when the substrate surface is illuminated with the pulsed energy source, it undergoes melting and re-crystallizes as it cools in between the pulses with a repetition rate of less than about 100 Hz or of about 1 Hz. Therefore, the melting briefly frees the first component from the substrate as a "melt." As the substrate is melting, the composition is decomposing, for example, by pyrolysis. Therefore, decomposing briefly frees the second component from the composition. As shown in box 20, the method then comprises forming a new compound on the substrate. Specifically, the second component diffuses into the melt comprising the first component, and upon cooling between pulses, the compound is formed on the substrate. Because the compound is only formed in regions of the substrate and composition that are exposed to energy pulses, surfaces of the substrate and composition that are not exposed to energy pulses are not exposed to high temperatures, i.e., they substantially remain at room temperature. This selective exposure to pulsed energy permits the compound to be deposited in any pattern, such that selective growth of a compound on a substrate is achieved. For example, the compound can be deposited as a film, a layer, pattern, or interconnected patterns or layers. Upon completion of the method 10, additional electronically active layers or contacts may be deposited on the compound or opposing surface of the substrate. The additional layers may be deposited by any method known in the art, including, for example, by vapor deposition, plasma enhanced chemical vapor deposition, epitaxial growth, e-beam evaporation, dipping, and solution coating.

Figure 3A:
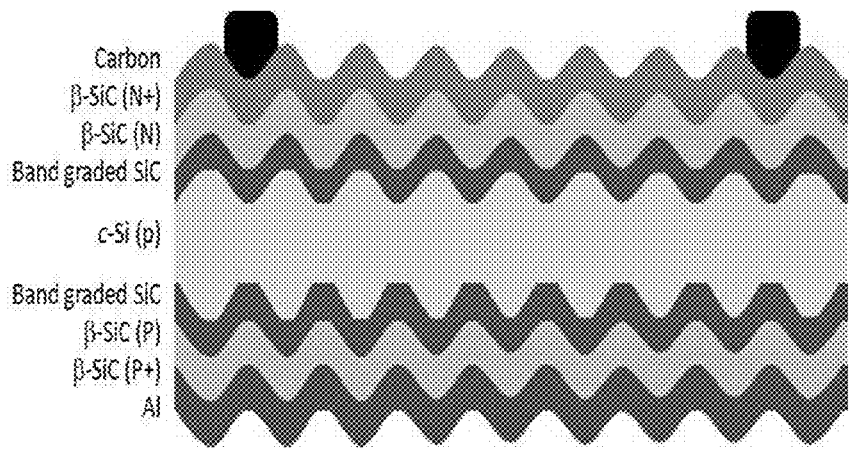
FIG. 3A is a schematic illustration of a double-sided heterojunction developed according to the current technology.
Figure 3B:
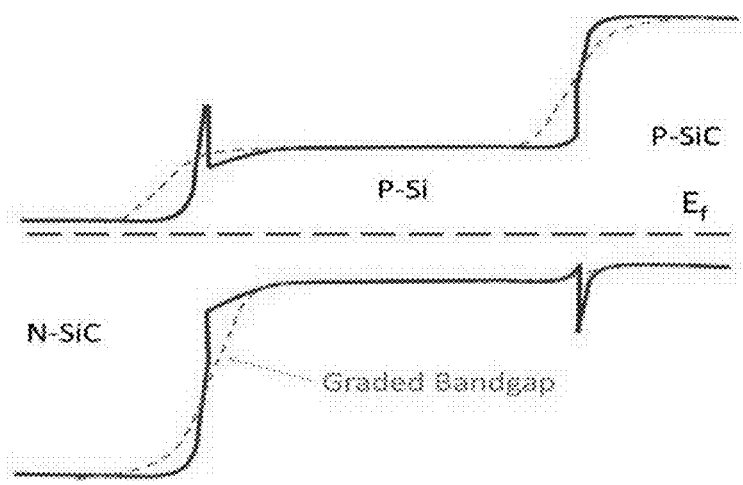
FIG. 3B is a simplified energy band diagram of the double-sided heterojunction shown in FIG. 3A.

Single side heterojunction devices or double side heterojunction devices can be generated by the method 10. For example, after the method 10 has been completed on a first side of a substrate, the method 10 may be repeated on a second opposing side of the substrate to form a double side heterojunction. FIG. 3A shows a schematic of an exemplary solar cell device having a double side heterojunction and FIG. 3B shows a simplified energy band diagram of the device shown in FIG. 3A. Here, in place of the a-Si:H buffer layers depicted in the device shown in FIG. 1, β-Sic layers are used on both sides of the substrate. These layers are formed by driving carbon into Si melt at the surface of a c-Si substrate by the method 10 of FIG. 2.

As discussed above, the method 10 can be used to form high quality heterojunction devices. Therefore, a heterojunction device is also provided. The heterojunction device a substrate and a compound deposited directly on the substrate, wherein the device is made by depositing a composition onto a surface of a substrate; illuminating the composition and the substrate with pulsed energy emitted from a pulsed energy source; melting the substrate and decomposing the composition simultaneously; and depositing the compound on the substrate, wherein a first component of the compound is derived from the substrate and a second component of the compound is derived from the composition. The method for making the device and the types of substrates, compositions, and compounds that characterize the device, may include any combination of limitations provided herein.

Method Variations

Figures 4A, 4B:
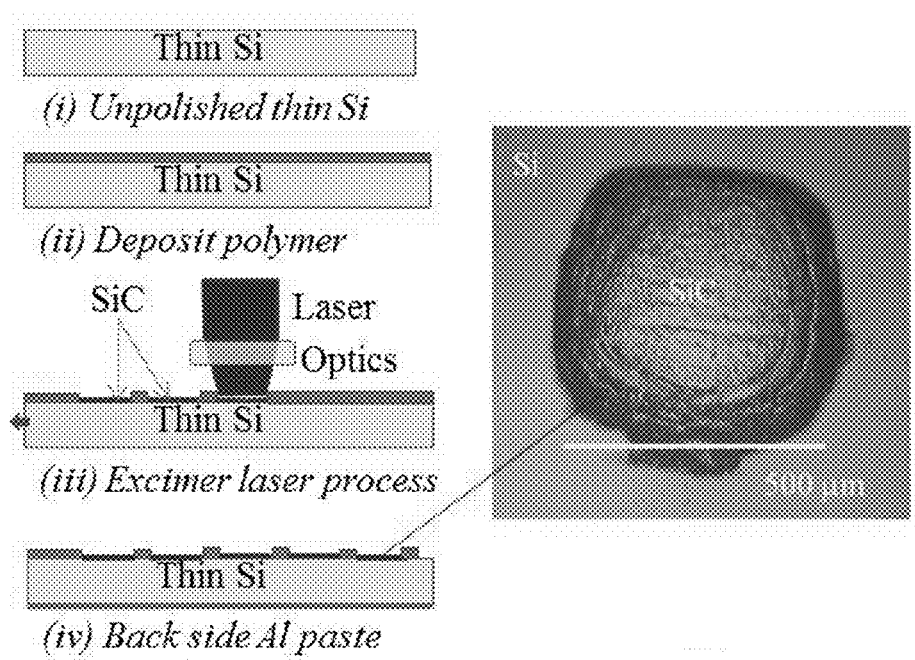
FIG. 4A is a schematic illustration of fabrication steps of laser processed SiC-Si heterojunction devices.
FIG. 4B is a photomicrograph of an exemplary fabricated device.

An exemplary embodiment of the current technology is shown in FIG. 4A, where a single side heterojunction solar cell is fabricated on a c-Si (p-type, $N_A \sim 2.5 \times 10^{14}/cm^3$) substrate using excimer laser pulses (energy=300 mJ, pulse=25 ns). FIG. 4B shows an optical micrograph of the exemplary device with a resulting compound comprising silicon carbide (SiC). As shown in the figure, a thin silicon wafer (250 μm) (FIG. 4A(i)) is coated with thin layer (1 μm) of PMMA (FIG. 4A(ii)). Then, the Si and PMMA are exposed to laser pulses (FIG. 4A(iii)). A carbon layer is formed by pyrolysis and at the same time the surface of Si is melted by the high power laser pulse. Carbon diffuses into the melt during this time and is immediately frozen in the melt upon cooling. A SiC film is formed during the cooling. An Al contact is shown on an opposing surface of the silicon wafer.

Figure 5:
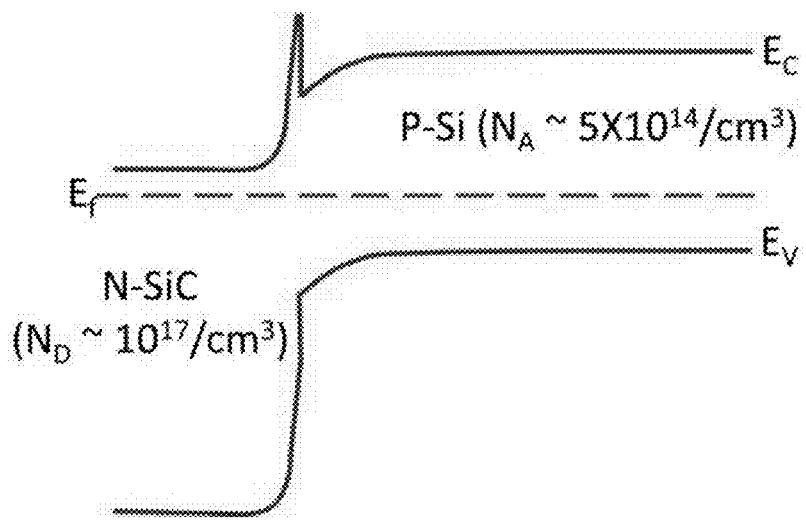
FIG. 5 shows a band diagram of a fabricated diode.
Figure 6A:
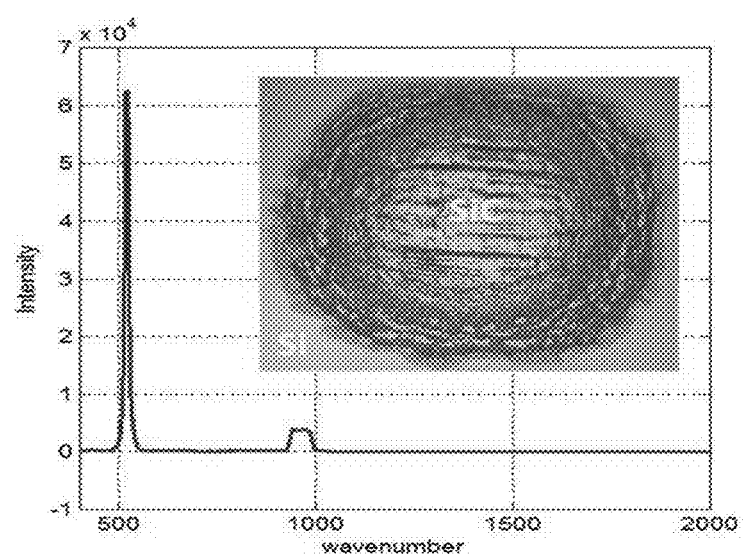
FIG. 6A shows Raman spectra of a SiC film on a Si substrate, wherein the inset is a photomicrograph of the film on the substrate.
Figure 6B:
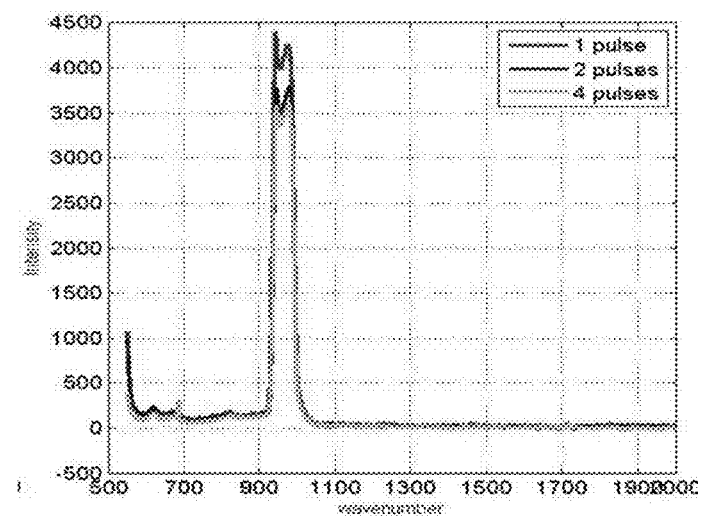
FIG. 6B shows an exploded view of the Raman spectra shown in FIG. 6A.

FIG. 5 shows a simplified band diagram of the heterojunction shown in FIG. 4B. A photomicrograph of an exemplary heterojunction generated by the current methods is shown in the inset of FIG. 6A. The exemplary heterojunction shown in FIG. 6A was generated by illuminating a polymer deposited on a silicon substrate with an excimer laser. Accordingly, the exemplary heterojunction includes a Si substrate with a layer of SiC. FIG. 6A also shows Raman spectra of the SiC on the Si substrate over a wide wavelength range. FIG. 6B shows an exploded view of the peak of FIG. 6A located immediately prior to 1000 $cm^{-1}$. Raman spectra were collected using a 532 nm laser source under ambient conditions (ambient temperature and ambient pressure). The strong intensity at 520 $cm^{-1}$ shown in FIG. 6A originates from the Si substrate. Spectra between 930 $cm^{-1}$ and 990 $cm^{-1}$ shown in FIGS. 6A and 6B are due to acoustical and optical phonon modes of cubic or hexagonal polytypes SiC. Peak broadening is related to the damping of phonon modes due to short range ordering of SiC crystallites and the effects of surroundings having Si, as well as C-clusters. The change in number of SiC bond by irradiation by different number of pulses could be inferred from a change in the intensity of Raman band. Such a high quality SiC film on Si substrate can be used in the fabrication of SiC-Si heterojunction solar cells, replacing CVD grown a-Si:H layer.

Figure 7:
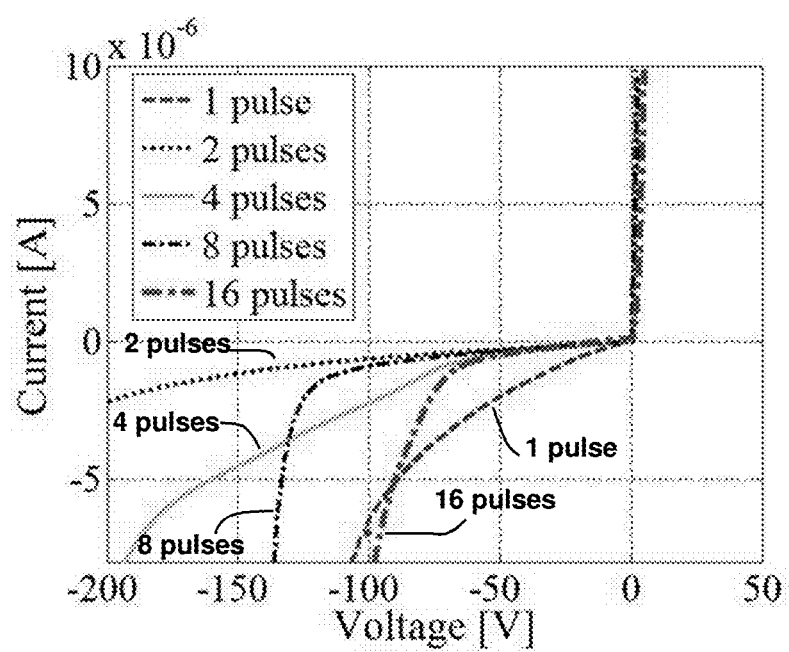
FIG. 7 is a graph showing measured J-V characteristics of a Si-SiC heterojunction fabricated using different number of pulses with high breakdown voltage.

FIG. 7 shows measured J-V results over a large voltage range for devices produced by varying the number of laser pulses. Devices with very high breakdown voltages, such as breakdown voltages greater than about 200 V, can be fabricated using this approach. For these devices, contacts are deposited by any method known in the art. For example, an aluminum (Al) back contact may e-beam deposited or generated by using aluminum paste. The J-V measurements of FIG. 7 show that high quality Si-SiC heterojunction devices can be formed with optimum number of pulses (optimum power transfer). The devices were measured over a large voltage range using a Keithley 2400 SourceMeter® source measurement unit (Keithley, Cleveland, Ohio). For the best performing diode (2 pulses) a rectification ratio of $3 \times 10^4$ (at ±1V) was obtained. It also shows a high reverse breakdown voltage of >200V (source limited) with leakage current of 6 µA/$cm^2$ and 44 µA/$cm^2$ at reverse bias of 1 V and 50 V, respectively. This leakage current is much smaller than previously reported for SiC/Si HJD's. The breakdown voltage for various devices is much higher than 200 V, but results shown here are limited by the measurement setup.

The leakage current increases for devices made using 4 and 8 pulses, which can be contributed to the edge effects, which is more prominent at sharp edges. Diodes may break down in regions where a breakdown field is reached first. These preliminary J-V measurements show that high quality Si-SiC HJDs can be formed by selecting optimum number of pulses (optimum power transfer). The SiC/Si material system experiences ~20% lattice and 8% of thermal expansion coefficient mismatch, and thus the CVD grown SiC contains a large number of extended defects, which results in a high leakage currents in 3C-SiC/Si devices. Here, the low leakage current indicates fewer defects at the interface. This is achieved due to band grading due to variation of Si to C ratio across the junction. The devices fabricated using 1 and 2 pulses show the highest reverse breakdown voltage with very small leakage current densities. The higher leakage current realized for 4 and 8 pulses can be attributed to carbon rich sharper edges. Thus, such diodes will break down in these regions first due to high field strength.

These preliminary J-V measurements show that high quality Si-SiC HJDs can be formed by selecting optimum number of pulses. The SiC/Si material system experiences ~20% lattice and 8% of thermal expansion coefficient mismatch, and thus the CVD grown SiC contains a large number of extended defects which results in high leakage currents in 3C-SiC/Si devices. The low leakage current in our fabricated devices shows fewer interface defects. From J-V measurements it can also be concluded that the conductivity of SiC layer is n-type which is due to unintentional doping of SiC with shallow donor nitrogen, which has a low binding energy of 15-20 meV. In the fabrication of SiC layer using a laser, nitrogen from the ambient environment is incorporated in the film during diffusion of carbon into Si melt.

Figure 8:
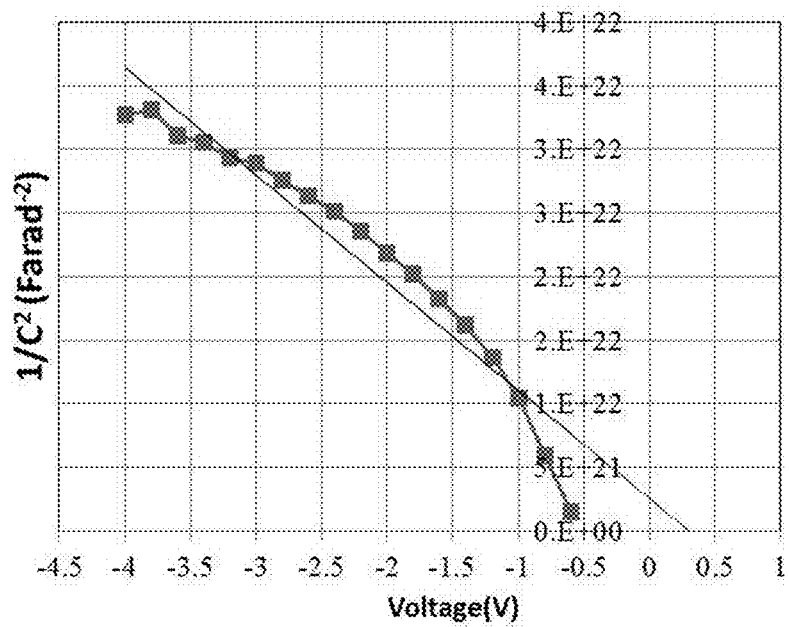
FIG. 8 is a graph that shows measured C-V characteristics of Si-SiC heterojunction, wherein a straight line is included for visual reference.

FIG. 8 provides a graph showing measured capacitance-Voltage characteristics. n type SiC/p-Si HJD'S were measured at 100 kHz with different number of pulses.

In anisotype heterojunctions, like n-SiC/p-Si, the capacitance as a function of applied bias voltage is given by the relation in equation 1, where $N_d$ is the effective density of state of n-type β-Sic (donor), $N_a$ is the density of acceptor impurities of p-Si, $\epsilon_d$, and $\epsilon_a$ are the dielectric constants of SiC and Si respectively, $\epsilon_0$ is the permittivity of free space, $V_{bi}$ is the built in potential, V is the applied voltage, C is the capacitance and A is the area of HJ.

$$\frac{C}{A} = \sqrt{\frac{q\epsilon_0\epsilon_a\epsilon_d N_a N_d}{2(N_a\epsilon_a + \epsilon_{d_a} N_d)(V_{bi} - V)}} \quad \text{equation 1}$$

Given the density of acceptor impurities (p-Si) about $2.0 \times 10^{14}$ $cm^3$ and assuming the dielectric constant of SiC to be 11, the doping level in β-Sic is about $5 \times 10^{15}$ $cm^{-3}$.

Figures 9A, 9B, 9C:
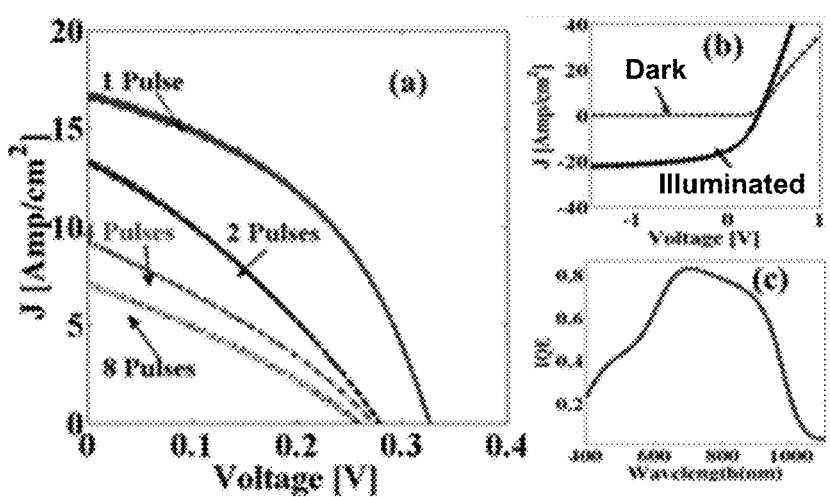
FIG. 9A is a graph showing measured J-V characteristics of a SiC/Si heterojunction solar cell for different number of pulses.
FIG. 9B is a graph showing dark and illuminated J-V curves for a single pulse device with current density ($J_{sc}$)=17 mA/cm$^2$, open circuit voltage ($V_{oc}$)=0.33V and fill factor of 62%.
FIG. 9C is a graph showing internal quantum efficiency (IQE) spectra.

FIG. 9A is a graph that shows measured J-V characteristics with differing number of pulses and J-V characteristics of a device with single pulse under dark and illuminated conditions is shown in FIG. 9B. The device has a current density (Jsc) of 17 mA/$cm^2$, open circuit voltage (Voc) of 0.33 V and fill-factor (FF) of 62%. The devices clearly show good optical conversion efficiency (~8%). Previously, similar results were obtained using CVD grown and sputter deposited SiC/Si HJ. The measured internal quantum efficiency (IQE) spectra for a SiC/Si HJD based solar cell is also shown in FIG. 9C. The spectrally resolved IQE exhibits a peak at about 650 nm, which coincides with a peak in previously reported SiC/Si solar cells fabricated using CVD and sputtering processes. The graph shows a good optical conversion efficiency of about 8%. The FF can be improved by depositing a thin conductive layer on SiC. Further improvement can be achieved by forming the devices on both sides of the substrate. This process is simpler than common chemical vapor deposition (CVD) processes and requires fewer fabrication steps, and more importantly, it does not require vacuum processing, which is an expensive fabrication step. These results show that high quality SiC layers are formed on Si substrates using laser processing.

Band-Gap Tailoring or Engineering.

The current technology also provides for band-gap tailoring of compounds deposited on substrates. A spatial variation of the band-gap within the absorbing region of a solar cell can be optimized to enhance absorption and improve probability of carrier collection. This optimization leads to increases in short circuit current density (Jsc) and open circuit voltage (Voc), which in turn help to improve solar cell efficiency. Band gap tailoring allows in the design of optimum field profile to enhance collection efficiency. Here, the band-gap of a compound deposited on a substrate can be tailored by varying the first component: second component ratio in the compound. For example, the band-gap is made larger by increasing the concentration of the second component in the compound. In various embodiments, the first component:second component ratio is about 1:1 to about 1:0. In some cases, to form interconnects the ratio may be about 0:1. More particularly, the first component:second component ratio can be varied by adjusting the energy pulse duration, amplitude power, and/or repetition rate. Accordingly, as shown in block 20, in various embodiments the current method 10 of FIG. 2 optionally includes tailoring a first component:second component ratio in the compound by adjusting at least one of the energy pulse duration, amplitude power, or repetition rate to create a thermal profile in the substrate that naturally controls the diffusion of the second component into the melt comprising the first component.

As an example of film grading, a device having a Si substrate and a composition comprising a carbon source can be combined to form a film of silicon carbide (SiC). The bandgap of the SiC film can be tailored by varying the Si to C concentration in the SiC. The band gap can be made larger by increasing the carbon concentration (limited to a maximum of 1:1 ratio) in the film. The bandgap can be varied between Eg of c-silicon (2.38 eV) to Eg of SiC (3.26 eV). The Si:C ratio can be varied using, for example, laser pulses. The pulse energy, power density, and repetition rate can be changed to create a thermal profile in the substrate that naturally controls the diffusion of carbon into silicon melt. The device depicted in FIG. 3A has a graded SiC layer as can be characterized by the smooth transitions shown in the energy band diagram of FIG. 3B. A ratio gradient can also be designed to achieve low stress films of SiC on Si.

As discussed above, high quality heterojunction devices with graded band-gaps can be prepared by the current method. Accordingly, the present technology also provides a heterojunction device comprising a substrate comprising a first component and a compound layer comprising a second compound and the first component deposited directly on the substrate and formed by the methods described herein, wherein the compound layer comprises a concentration gradient. The concentration gradient is characterized by an increasing or decreasing first component:second component ratio from a compound surface in contact with the substrate to an opposing compound that is not in contact with the substrate. In various embodiments, the heterojunction device comprises a Si substrate and a compound layer comprising SiC with a Si:C ratio. The Si:C ratio increases or decreases from a SiC surface in contact with the Si substrate to an opposing SiC surface that is not in contact with the Si substrate.

Surface Texturing.

Antireflection (AR) layers or coatings are often applied to solar cells to improve their efficiency. An alternative to treating a surface with an AR coating/layer, which is built of many stacks of dielectric films, is texturing of the surface. Textures are typically formed on top of fabricated solar cells through elaborate processes, such as wet etching, polymer embossing, etc. Texturing is beneficial as it provides better performance than the thin dielectric based AR coating techniques. Moreover, texturing allows efficient coupling and light trapping over a wide spectral band. As shown in block 22, in various embodiments the method 10 of FIG. 2 optionally includes texturing the compound. In the current method 10, texturing is optionally achieved during formation of a compound layer on a substrate. In particular, texturing is engineered by adjusting pulse rate and the focal point of the pulsed energy source. The texturing increases with increasing in number of pulses hitting the surface and thus an optimized number pulses can be used to achieve texturing. In various embodiments, texturing results in a pyramidal and/or Gaussian (sinusoidal like) surface. Without being bound by theory, the top surface roughness of a solidified melt can be affected by a rippling effect that occurs due to surface tension forces exerting a shear force on a liquid surface. This affect is primarily due to a surface temperature difference between a source of energy and a solidifying zone caused by the motion of the pulsed energy source. Beam shaping and spot overlapping can also be used for larger scale surface texturing.

Figure 10A:
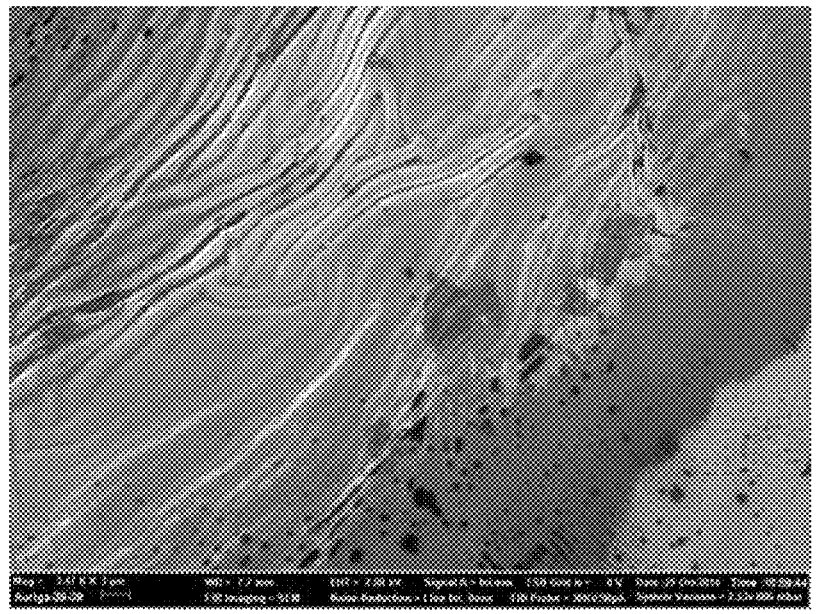
FIG. 10A is a scanning electron micrograph (SEM) of a SiC layer treated with multiple fixed power laser pulses.
Figure 10B:
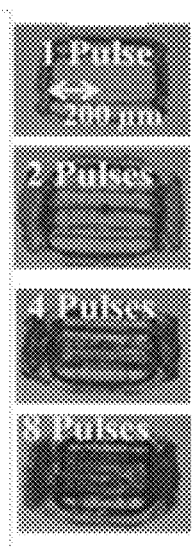
FIG. 10B shows photomicrographs of devices generated from different number of pulses.

As an example of texturing, a device having a Si substrate and a composition comprising a carbon source can be combined to form a film of silicon carbide (SiC) with a textured surface. The texturing is achieved during the formation of SiC layer on Si substrate by controlling the pulse rate and focal point of an excimer laser. FIGS. 10A and 10B show photomicrographs of textured surfaces formed during SiC growth on a polished Si wafer with an excimer laser.

Carbon Interconnects.

Figure 11A:
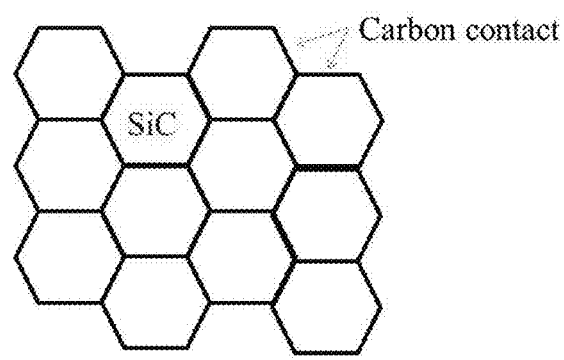
FIG. 11A is a schematic representation of a highly doped SiC top layer surrounded by hexagonal carbon conductor lines.
Figure 11B:
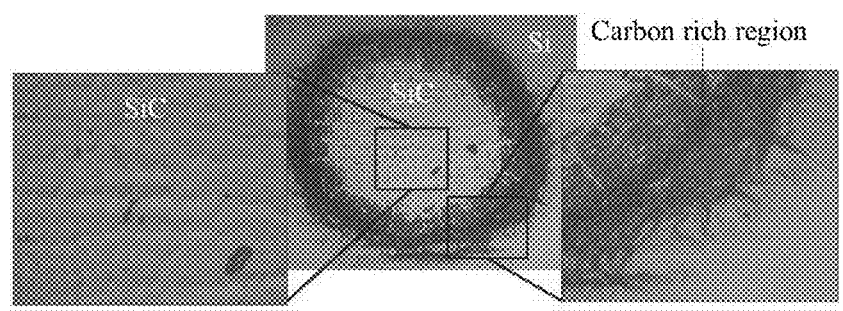
FIG. 11B is a photomicrograph showing carbon contact formation on the perimeter of a device.

In a typical solar cell, the surface is covered with conductive oxide (such as indium tin oxide, ITO) and silver (or other conductors) by screen printing to help carry out the current to the battery (a multistep process). Here, the current method is used to print carbon based conductive traces. Accordingly, the current technology also provides a process for forming interconnects for solar cells or other devices by achieving carbonization of a polymer using a pulsed energy source. In particular, interconnects are formed by illuminating a substrate and composition with a pulsed energy source, wherein energy is focused such that its power on its periphery is sufficient to carry out pyrolysis of the composition, but low enough that the substrate is not melted, and its power in a center region is sufficiently high so that it melts the surface of the substrate to thereby form a compound. For example, carbon contacts can be generated by a device by depositing a carbon source on a silicon substrate, and illuminating the substrate and carbon source with an excimer laser. As shown in FIG. 11A, hexagonal shaped conductive rings are formed on the edges of Si-SiC devices, which helps carry current while minimizing the dead space, i.e., the region shadowed by the interconnects. Through this method, screen printing of silver paste can be avoided, which saves labor time and cost of materials. Conductive rings can be formed simultaneously during the growth of SiC films. This formation is achieved by controlling the beam profile using a shadow mask. FIG. 11B shows a fabricated SiC-Si heterojunction device with carbon ring on the perimeter for current collection. The excimer laser was focused as such that the power on the periphery was sufficient to carry out pyrolysis of polymer, but low enough that Si is not melted. However, the power in the center of the beam was significantly large so that it melted the surface of the Si wafer and helped form the SiC film.

SiC Doping.

Doping compound films on both sides of a substrate is typically required to form efficient double side heterojunction solar cells. A compound film on a first side of the substrate requires an n-type dopant and a compound film on a second opposing side of the substrate requires a p-type dopant. Doping of a compound film of, for example, SiC is complicated by two facts: (i) the dopant can occupy either the Si or the C site; and (ii) the diffusion rate in SiC, which has a tight bond and dense structure, is slow. In various embodiments of the current technology, SiC layers may be doped with donor nitrogen, which is shows n-type behavior. The origin of the n-type doping is due to shallow donor nitrogen with a binding energy of from about 15 to about 20 meV. The donors can be present in a deposited SiC film in concentrations of less than about $10^{18}$ cm$^{-3}$. For example, SiC films grown using chemical vapor deposition process are mostly unintentionally n-type doped due to presence of nitrogen source during growth from gas precursors such as methylsilane (99%), or due to other contaminates. Nitrogen is also the most commonly used n-type dopant for SiC. Traditionally, a nitrogen doped film can be grown by addition of Nitrogen gas to the source gas during CVD process. The carrier concentration can be controlled by changing the mole ratio of $N_2$ gas to other gases (used for SiC synthesis). In situ doping of sputtered SiC can be achieved by introducing nitrogen into the electric discharge during the growth process. In the fabrication of SiC layer according to the present technology using a pulsed energy source, such as an excimer laser, a silicon substrate and a composition comprising a carbon source, nitrogen from the ambient atmosphere is incorporated into the SiC film during diffusion of carbon into a Si melt. Therefore, the current method optionally includes doping the compound with nitrogen.

Thermal diffusion, ion implantation and spin on doping are the most common methods of doping SiC. Thermal diffusion of dopants requires high processing temperatures and can cause impurity contamination and deterioration of crystallizing SiC. Ion implantation can also severely damage the lattice structure. Laser-induced doping of SiC films has been used in past to dope SiC without the use of very high temperature. Here, pulsed energy sources, including excimer lasers, can be used to assist doping of SiC with nitrogen, aluminum, chromium, phosphorous and boron. Doping with excimer lasers offers the advantage of locally increasing the temperature without heating the whole substrate. Moreover both doping and dopant activation can be achieved in a single process. The high power pulsed laser (excimer laser) with nanosecond durations enables the application of a large amount of energy in a short duration. Under controlled conditions, surface melting of SiC does not exceed a depth of a few hundred nanometers for the rapid solidification from the bulk, allowing the dopant to be incorporated by liquid phase diffusion. This is same as principle of laser induced dopant incorporation for Si which is also a melt/growth process.

P-type doping of SiC can be achieved with a boron spin-on dopant solution and irradiation with a pulsed energy source, such as a high power excimer laser pulse. Laser based doping can also be carried out for p-type doping using spin-on dopants (SOD) as impurity sources. Spin-on doping permits precise control of dopant through application of a homogeneous solution to the substrate. Laser pulses liberate the dopant atoms from spin coated thin film through thermal dissociation where laser heats the sample. Thereafter, the dopant undergoes rapid diffusion into liquid phase substrate material. The dopant atoms rearrange themselves into the lattice upon cooling.

The advantage of using lasers for doping is that it allows only shallow depth as the excimer laser is strongly absorbed in the surface region of the wafer. Furthermore, laser processes allow doping in selected regions and also prevents redistribution of impurity profiles due to very short durations of pulse irradiation. This method does not require expensive equipment, ultrahigh vacuum or toxic gas sources. The thickness of the doped layer depends on the amount of energy absorbed by SiC. SiC exhibits high absorption at 248 nm, which results in thin doped layers. Excimer lasers also provide concentrated localized temperature rises, which also help in diffusion of boron. Due to localized heating, the temperature decreases quickly, which causes the dopant to become trapped in the film. Therefore, a doping profile may be controlled by adjusting the energy density of the pulses.

Use of Low Cost Unpolished Wafers.

One of the major contributing expenses to the manufacture of solar cells, diodes, etc. is the silicon substrate. From the growth of the boule to final wafer production, a considerable amount of cutting, grinding, lapping and polishing is performed. Lapping and polishing can amount to as much as 50% of the substrate cost. Thus, in the manufacture of solar cells, as-cut Si wafers (without lapping and polishing) are desirable. As discussed above, excimer lasers have been used to transform thin layers of amorphous Si (50-200 nm) into high quality polycrystalline Si with greatly enhanced electron mobility, for use in flat-panel displays for mobile phones and flat-screen televisions. As cut, wafers have many surface defects and these defects can be eliminated by laser melting a surface layer. In accordance with the present technology, during the formation of compound layers, such as compound layers of SiC, the surface of the substrate, such as a Si substrate, undergoes melting and solidification, which naturally reduces surface defects. Therefore, the substrates used in the current methods can be unpolished.

Figure 12:
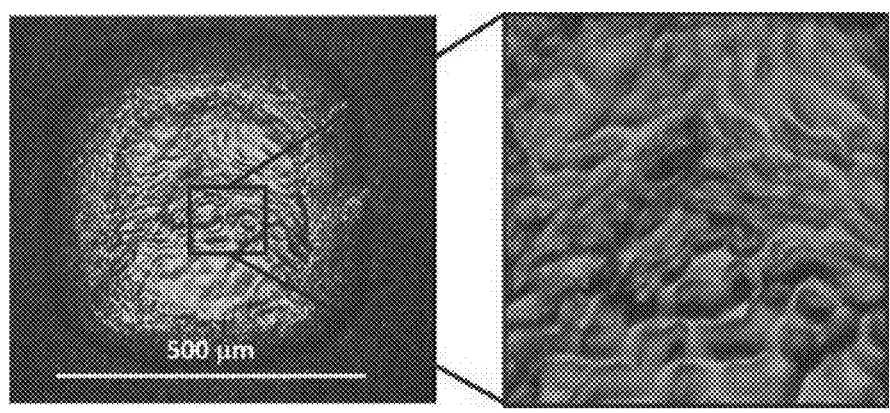
FIG. 12 is a photomicrograph of a device fabricated using a laser on an unpolished Si wafer (4 pulses)
Figure 13A:
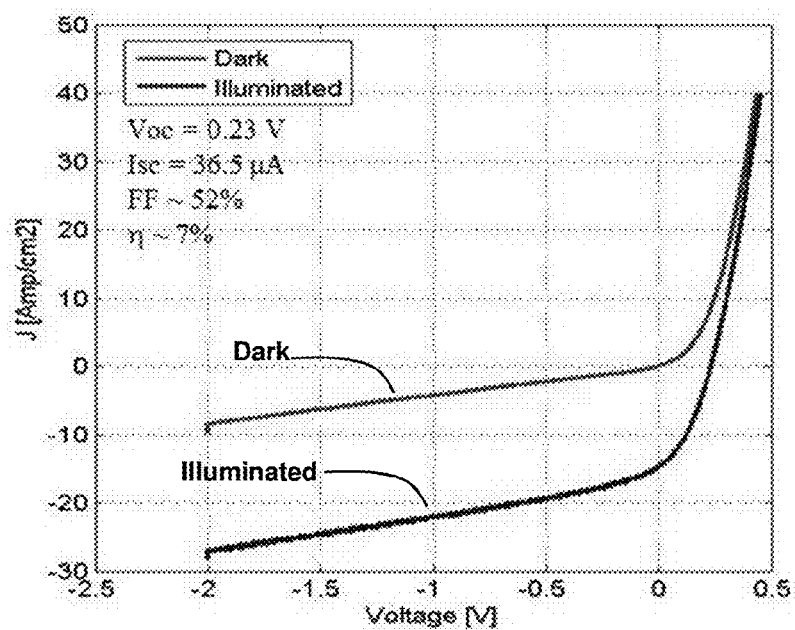
FIG. 13A is a graph showing J-V characteristics of devices on unpolished wafers under dark and illuminated condition for a single pulse device.
Figure 13B:
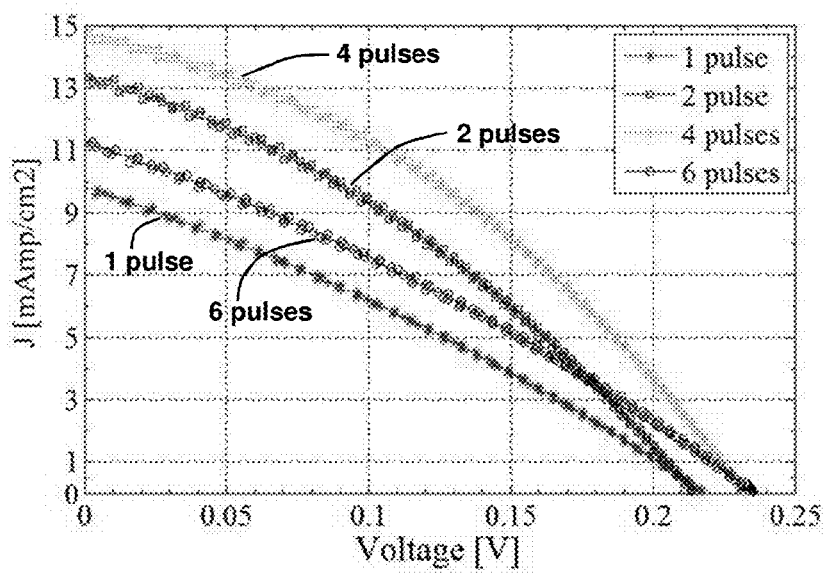
FIG. 13B is a graph showing measured J-V under illumination conditions for devices fabricated using differing numbers of laser pulses.

FIG. 12 shows a micrograph of a device fabricated on an unpolished (as-cut) 250 µm thick silicon wafer (NA~$10^{15}$/cm$^3$). As shown in the figure, there is a clear contrast between the SiC region formed from the silicon melt and the neighboring unpolished Si region. As shown in the exploded view on the right side of the figure, the SiC structure forms a texture that is useful as an anti-reflection layer. J-V characteristics of this device were also measured and are shown in FIG. 13A under dark and illuminated conditions. Measured J-V of different devices formed using different number of pulses is also shown in FIG. 13B. In these devices, aluminum was coated on the back side on p-type Si, and no metal coating was carried out on the SiC layer. J-V of the device was measured by probing the perimeter region, which is carbon rich (carbon ring). These preliminary results show that high quality Si-SiC heterojunction devices can be formed on low cost unpolished Si wafers. In particular, the pulsed energy source, such as an excimer laser, melts and improves the quality of the surface region while forming a SiC layer.

Thin Si Growth from Small Particles.

In various embodiments, the current method also includes sintering of silicon particles spray deposited on a thin metal substrates (foil) prior to the formation of SiC layer. Si powder (micron to submicron sized particles) coated on a metal foil is melted using a pulsed energy source, such as an excimer laser, to achieve high quality Si growth on a low cost large area substrates. This embodiment reduces Si substrate cost and enables the growth of solar cells on 3D platforms, such as, for example, rooftops of a cars, house sidings, etc. Silicon on metal foil is compatible with a roll-to-roll process (similar to newspaper printing) which is known to be an ultra-low cost process as it can be completely automated. The metal foil also acts as the back conductor as needed to form a close circuit loop. The growth of Si and formation of a SiC layer can be carried out in parallel by using two pulsed energy sources, such as excimer lasers, working in parallel. For example, the first laser sinters and forms a thin Si layer on a metal sub-substrate and the second laser forms the SiC layer on the Si.

Embodiments of the present technology are further illustrated through the following non-limiting examples.

Example 1

SiC/Si heterojunctions (HJs) are a promising candidate for a wide range of applications such as high-voltage converters, photovoltaics, high power high frequency devices, high temperature circuits, optical diodes, etc. SiC is an excellent material for these applications due to its wide bandgap, high thermal conductivity, high electron mobility, and chemical stability. Out of the various existing polytypes, β-Sic exhibits the lowest bandgap and excellent electronic properties such as high electron mobility.

Different growth techniques have been investigated to achieve heterojunctions (HJ) with low crystal defects that occur due to the lattice mismatch between the SiC and Si. Chemical vapor deposition (CVD) and magnetron sputtering are the most common techniques used to deposit SiC on Si substrates; however, they require high vacuum and high temperature (>1000° C.) for growth of high quality SiC. The thin films grown at very high temperatures leads to high stress and formation of cracks due to lattice mismatch and difference in thermal expansion co-coefficients. In addition, HJ's formed at high temperatures can lead to diffusion of dopants from Si to SiC. Therefore, a growth technique that does not require high temperature annealing of Si substrate and also a technique that does not require vacuum processing is desirable to reduce manufacturing cost.

Recently, laser synthesis techniques have been used to transform solid carbon sources to graphene directly on Si and quartz substrates. High power lasers, such as excimer lasers, have also been used to transform thin layers of amorphous Si (50-100 nm) into high quality polycrystalline Si through melting and recrystallization. As discussed herein, laser irradiation with very high power is capable of dissociating solid carbon sources and also melting silicon which can give rise to a new mechanism of SiC growth.

Here we report a novel method to synthesize SiC using pulsed KrF excimer laser radiation. This technique is based on focusing a laser beam through a carbon (C) film layer onto an absorbing substrate (Si) and creating a local hot-spot where the Si surface melts and reaction between Si and C takes place to form SiC. A thin coating of polymethyl methacrylate (PMMA) on Si is used to provide the carbon through pyrolysis. The substrate is held under ambient conditions (pressure and temperature) during this process, and both polished and unpolished wafers can be used to form high quality devices. Direct synthesis of SiC on Si using lasers under ambient conditions is reported here for the first time.

Device Fabrication

Si C/Si HJ devices (HJDs) were fabricated by growing unintentionally n-type doped SiC on single side polished p-Si (111) substrate (30-50 Ω-cm, thickness=250 μm; "silicon wafer") using a laser synthesis technique. The silicon wafer was prepared by first removing the native oxide using a buffered hydrofluoric acid (HF) solution followed by spin coating of a thin layer of PMMA (~1 μm). The silicon wafer was then placed on a XYZ manipulator at room temperature and atmospheric pressure with air background. The silicon wafer and PMMA (the "sample") was then irradiated with a high power KrF excimer laser beam ($\lambda$=248 nm, pulse duration ~25 ns). The excimer laser beam was directed onto the substrate through an optical path that homogenizes and shapes an intensity profile to achieve uniform illumination across a desired focal area. Accordingly, an area of the silicon wafer is irradiated and undergoes melting and re-crystallization during the pulses (<1 Hz repetition rate). The laser beam simultaneously decomposes PMMA while melting the surface of Si. The PMMA provides a solid carbon source through pyrolysis for SiC synthesis.

Several devices were formed by irradiating polished Si with differing number of pulses (1, 2, 4 and 8 pulses). As the pulse width is narrow (~25 ns), cooling takes place immediately following the pulse. An optimum number of pulses needed to form a high quality SiC film was determined by measuring optical and electrical characteristics. The average area of the device obtained was approximately 350×520 μm², which was dictated by focusing of the laser beam. Larger devices can be formed by restring the laser beam across a substrate. For this study, the size of the devices was limited to the average size achieved without rastering. Nickel (Ni~50 nm) was used to form a contact to SiC and Aluminum (Al) was blanket deposited on the backside of the p-Si wafer using e-beam deposition. No annealing was carried out after the deposition of these metal films prior to any measurements.

Conclusion

Here, an alternative low cost technique for synthesizing a n-SiC/p-Si heterojunction under ambient conditions using lasers is demonstrated. The electrical performances shows that devices with very high breakdown voltages (>200 V) can be fabricated using this approach. Diodes shows good rectification ratio of 3.0×10⁴ at ±1.0 V and leakage current density of 6 μA//cm2 (1 V). A solar cell with efficiency of 8% is demonstrated. The device quality may further be improved by reducing series resistance and further optimizing laser pulse power. This process may be utilized in the growth of SiC devices through post processing of complementary metal-oxide-semiconductor (CMOS) wafers.

Example 2

This example presents the growth and characterization of SiC/Si heterojunction diodes for microwave circuit applications. A novel process based on selective growth of SiC using KrF excimer laser on a polymer coated Si wafer under ambient conditions (in air at atmospheric pressure and at room temperature) is presented. Laser irradiation with high power leads to dissociation of solid carbon sources and melting of silicon simultaneously, which leads to growth of SiC. A Raman spectrum of the grown samples shows peaks for acoustical and optical phonon modes for β-Sic between 940 cm-1 and 980 cm-1. The device fabrication process is post-CMOS process compatible as it allows localized growth of SiC on Si and thus offering limited damage to the substrate and surrounding circuits. The fabricated diodes show high breakdown voltage (>200 V) and low leakage current density of 3-5 μA/cm2 (−5V). Experimental results for DC characteristics, microwave rectification and frequency multiplication are presented. The diodes are fabricated on two types of Si wafers with different doping densities. The diodes fabricated on wafer with higher doping show lower series resistance and thus perform better at higher frequencies. The best performing diode works efficiently as microwave rectifier with rectification sensitivity of about 8.4 mA/W at 3 GHZ. The diodes also work well as frequency doubler over wide frequency range of 2-6 GHz. This laser fabrication process has potential in developing low cost, high power microwave diodes by enabling direct localized growth on Si substrates.

Introduction

Affordable high power microwave devices are desired for emerging applications in wireless communication as well as for continuous progress in defense applications. High power RF devices have applications in base station transceiver systems, high-speed communications, automotive collision avoidance and homeland security. High frequency solid state devices are limited by transit time and thus require smaller sizes. However, compact devices suffer from increased temperature of operation as they cannot handle high power densities. Wide bandgap materials like GaN and SiC are of interest as they can handle high power densities unlike conventional semiconductors which are limited by saturated charge carrier velocity at high electric field. Over the past two decades, a variety of microwave devices based on GaN and SiC, including metal semiconductor field effect transistors (MESFETs), heterojunction bipolar transistors (HBTs), high electron mobility transistors (HEMTs), static-induction transistors (SITs), and impact ionization avalanche transit-time diodes (IMPATT) have been demonstrated. Recently, SiC has regained interest for power applications. In comparison to GaN, SiC has higher thermal conductivity and can theoretically operate at higher power densities. Although SiC has lower carrier mobility, it is still adequate for transistors designed for high-power operation in the microwave frequency range and also exhibits high saturation velocity. SiC exists in a large number of polytypes. In comparison to other polytypes, 3C-SiC has a smaller bandgap, but has higher electron mobility and is thus advantageous in device applications, such as MOSFETs. Additionally, it is possible to grow 3C-SiC epilayers on Si which makes it a less expensive alternative. Integration of high power materials with Si is very important to enable mass production of low cost, high power devices for commercial millimeter-wave applications. Integration with Si is also very important for future millimeter-wave integrated circuits which require CMOS circuitry for data conditioning and signal processing, and mixed signal circuits.

The most commonly used integration techniques are hetero-epitaxy of different semiconductors and hybrid integration approaches (non-epitaxy) techniques. Traditional hybrid integration approaches such as wire bonding, flip chip, multichip assemblies provide short term solutions. Direct growth of compound semiconductors (CS) on silicon substrates is desired. The biggest challenge for direct growth is lattice mismatch and coefficient of thermal expansion (CTE) mismatch. Thermal mismatch is a bigger problem as the growth of GaN or SiC is usually carried out at temperatures above 1000° C. The use of such high temperatures can also cause re-distribution of dopants in Si substrates and the accumulation of thermal mismatches at junctions.

In recent years, different techniques have been used to solve this challenge using approaches such as buffer layer engineering in epitaxy of GaN on Silicon to suppress crack formation and use of low temperature molecular beam epitaxy (MBE) or plasma enhanced chemical vapor deposition (PECVD) for depositing SiC. A more attractive approach as compared to large area epitaxy on Si is localized growth. Localized small area epitaxial growth can potentially help in reducing misfit dislocation density in lattice mismatched systems by reducing dislocation interaction and multiplication. As the growth area is limited to few mm$^{2t}$ the quality of heterogeneous grown CS on silicon can be better optimized. This also allows direct/selective integration of CMOS and high power microwave devices on a common silicon substrate. Recently, local epitaxy of InP is carried out on the lithography defined Lattice Engineered Substrate Si wafer (growth windows). However, these techniques still require complex epi-layer engineering and use of unique silicon substrate wafer for local epitaxial growth. Thus, these techniques are not very cost effective. In addition, no local epitaxy technique has been demonstrated for SiC. So, there is a need for alternate techniques for the growth of SiC on Si for heterogeneous integration of high power microwave circuits along with CMOS devices.

Other than direct deposition of SiC on Si using traditional techniques such as CVD, PECVD and MBE, other indirect techniques have also been demonstrated. For example, growth of SiC on Si using thermal annealing of pre deposited C60 film which causes diffusion of carbon into Si. Rapid thermal annealing (RTA) has also been used to grow SiC on Si substrates. RTA requires much lower temperature than the conventional CVD or furnace annealing (FA) because of enhanced SiC crystallization at high heating rates. Although RTA annealing has advantages over FA, it still requires heating of the whole substrate and thus is not post-CMOS process compatible. However, laser based annealing is a promising technique to achieve localized heating. Laser based annealing has been used as an alternative to classical thermal annealing for various applications such as doping of crystalline Si and SiC, recrystallization of amorphous Si wafer for thin film transistors.

High power excimer lasers have the ability to deliver large amounts of energy into a confined region of material in order to achieve desired temperature response. Selective growth of SiC/Si heterojunction diodes using high power KrF (nano-second) excimer laser annealing has been demonstrated herein. The technique is based on focusing a laser beam onto a carbon rich polymer film layer directly deposited on a Si substrate. Laser irradiation with very high power is capable of dissociating solid carbon sources and melting silicon, which leads to growth of SiC. The key mechanism for laser processing on semiconductors with a high power laser is photo-thermal (pyrolytic) where the absorbed laser energy is directly transformed into heat. High power laser with fluences above the threshold of melting of material can lead to much higher solubility than in the solid phase, resulting in rapid material homogenization. In addition, laser based annealing offers many faster diffusion paths for C atoms to diffuse into Si and form SiC formation. Also, due to extremely high heating and cooling rates in significant changes can occur to the material in short durations. For instance, enhanced diffusion rates for impurity doping, and the reorganization of the crystal structure.

Most semiconductor materials have a strong absorption in the UV spectral region and the energy is absorbed near the surface region modifying surface chemistry, without altering the bulk. Therefore, this process offers limited damage to the substrate and neighboring circuits. The other advantages of using laser based technique for growth of SiC are growth under ambient conditions, rapid heating and cooling rate, and post CMOS compatibility. The details of the laser based process, and DC and RF characterization of SiC/Si heterojunction diodes are presented in this paper. Fabricated diodes show high breakdown voltage (>200 V), high rectification ratio and low leakage current densities. The diode also works efficiently as high power microwave rectifier and frequency doubler.

Device Fabrication

SiC/Si diodes were fabricated on two different types of wafers, both are p-type doped having different carrier concentrations and thickness. The diodes made on low doped wafer carrier concentration of 4.3×1014 cm-3, thickness=250 μm, are refereed as diode type A and a diode made on a wafer with a higher doping concentration of about $3\times10^{15}$ cm$^{-3}$ and thickness of 150 μm is refereed as diode type B.

The wafers were first cleaned with acetone and isopropyl alcohol in an ultrasonic bath for 5 min. each, followed by a 5 min. rinse in deionized (DI) water. The wafers were then cleaned by etching with a buffered hydrofluoric acid (HF) solution to remove native oxide followed by a DI water rinse. This step was followed by spin coating of a thin layer of PMMA (about 400 nm), and baking for 90 sec. at 180° C. The sample was then irradiated with high power KrF excimer laser (λ=248 nm, pulse duration ~25 ns), FIG. 14. Use of lasers with such smaller wavelengths allows for local modification of surface properties without altering the properties of the bulk region. The growth of SiC on Si is carried out by localized heating while holding the substrate under ambient conditions (in air at atmospheric pressure and at room temperature). Confinement (localization) of energy is achieved by controlling the laser spatial profile by focusing a beam through optics, and beam shaping through homogenizers, apertures and refractive elements. The irradiated area of Si undergoes melting and re-crystallization in a very short period of time. The laser beam simultaneously decomposes PMMA and melts the Si surface. The PMMA provides a solid carbon source for SiC synthesis. The average area of an as grown device is 350×500 μm² which is dictated by the focusing optics. To realize RF circuits with working frequencies in the GHz range, much smaller devices than this area are needed. Thus, further processing is carried out to reduce the device area and to deposit the contact layers. The steps to fabricate small area diodes and to make contacts to Si and SiC are shown in FIG. 14, panels III-VI. The SiC/Si diodes are also coupled into coplanar waveguide (CPW) feed network structures for on-wafer probing and high frequency characterization.

First, a thin layer of Ni (200 nm) is deposited by e-beam deposition followed by deposition of a 200 nm layer of Al (FIG. 14, panel II). The bottom Ni is used as an Ohmic contact to SiC while Al is used here as a hard mask for etching SiC using SF$_6$/O$_2$ based reactive ion etching (RIE). The metals were patterned and etched to open a window for etching SiC. Al was etched using H$_3$PO$_4$:HAc:HNO$_3$:H$_2$O (16:1:1:2) and Ni was etched using FeCl$_3$. After patterning of the first layer, SiC was etched using SF$_6$ and O$_2$ plasma, FIG. 14, panel III, using a power of 200 W, a plasma time of 3 min., SF$_6$/O$_2$ flow of 20/5 sccm, respectively. The diode junction area achieved after etching SiC was about 70×70 μm². After etching of SiC, 300 nm of SiO$_2$ was deposited using PECVD process, FIG. 14, panel IV. The oxide was grown to passivate the surface after etching SiC. The oxide was patterned and etched to open a window on the Si, FIG. 14, panel V. After etching SiO$_2$ using buffer oxide etch (BOE), the second metal layer (Al) is deposited which acts as an Ohmic contact to the Si side of the diode. In a final step, the second metal layer is patterned to release the diode structures, FIG. 14, panel VI. The Ohmic contacts on both SiC and Si sides are annealed at 450° C. for 5 min.

The fabricated CPW structure is shown in FIG. 15. The ground (G) pad of CPW directly contacts the Si substrate, and the signal (S) pad contacts the SiC layer. The SiC/Si diode characteristics are measured between the G and S pads. Several SiC/Si devices were formed using different number of laser pulses. The best devices were formed by 2 pulses, similar to the work presented above. Here, the DC and RF characterization of devices fabricated from SiC formed using 2 laser pulses is presented.

Raman spectra for a device fabricated using 2 laser pulses is shown in FIG. 16. The Raman measurement was carried out in backscattering geometry using a 532 nm laser. The peak at 521 cm$^{-1}$ is from the silicon substrate and the peaks between 940 cm$^{-1}$ and 980 cm$^{-1}$ are due to acoustical and optical phonon modes of β-Sic. Peak broadening is due to damping of phonon modes by short range ordering of SiC crystallites. The usual forbidden Transverse optic (TO) mode around 796 cm$^{-1}$ is not observed here; however, the LO mode peaks matched well with previous results. The absence of TO mode also suggests the absence of stacking faults, stress and dislocations at the interface. The inset of FIG. 16 shows an optical image of a SiC/Si diode fabricated using 2 laser pulses.

Experimental Results

A. Current—Voltage Characteristics.

All of the measurements presented in this example were carried at room temperature and under dark conditions using a Keithley 2400 source meter. The measurements are shown for diodes made with 2 laser pulses (optimum power transfer). FIGS. 17 and 18 show the measured current density-voltage (J-V) characteristics of s large area (500×350 μm²) SiC/Si diode over a large voltage range for diode type I and diode type II, respectively. Both diodes show a high reverse breakdown voltage of greater than 200V with very small leakage current. The breakdown voltage for the diodes made with 2 pulses is much higher than 200 V, but limited by measurement set-up. Diode type I shows leakage current density of about 3 μA/cm² (−5 V), while diode type II shows slightly higher current density of about 5 μA/cm² (−5V) as expected due to the higher doping of Si. The measured leakage current is lower than previously reported for SiC/Si diodes fabricated using standard techniques, such as CVD and sputtering. The CVD grown SiC contains a large number of extended defects due to lattice and CTE mismatch, which results in high leakage currents. Thus, the small leakage current indicates fewer defects at the interface. This phenomenon can be contributed to localized growth of SiC, which can potentially help in reducing misfit dislocation. It can also be concluded from the J-V measurements that the conductivity of the SiC layer is n-type, which is due to unintentional doping of SiC with nitrogen, which has very low binding energy of 15-20 meV. It is concluded that nitrogen from the ambient is incorporated in the film during the laser process. The quality of diode can be accessed by fitting the measurement current-voltage characteristics to the diode equation, Eq. (2):

$$I = I_0\left[\exp\left(\frac{e(V - IRs)}{nkT}\right) - 1\right] \quad (2)$$

where, I is the measured current, e is the charge of an electron, Rs is the effective series resistance/contact resistance, T is the temperature, k is the Boltzmann constant, I$_0$ is the saturation current, n is the ideality factor and V is the applied bias voltage. The inset of FIGS. 17 and 18 show plots of log I vs. V and curve fitted diode equation at room temperature for diodes type I and II, respectively. The diode type I shows n=3.4 and Rs=25 kΩ and diode type II shows n=2.8 and Rs=6 kΩ. The type II diodes show lower series resistance and higher forward current as expected due to higher doping levels of wafer.

B. SiC/Si Diode Based Microwave Detection

Microwave or millimeter wave detectors are fundamental building blocks for applications such as wireless power transmission, concealed weapon detection, spectroscopy and medical imaging and energy recycling. For high power rectification devices based on wide-bandgap semiconductors are required. In this example, performance of SiC/Si heterojunction diodes fabricated using laser process was investigated for microwave detection. All measurements were carried out at room temperature by probing the devices using a high frequency 50Ω coplanar GSG probe. For the measurement, signal (RF+DC) is applied to the device through a CPW probe, T-Bias and via a directional coupler (HP87300B). The directional coupler is used to acquire incident and reflected waves from the device. The reflected/incident signal is measured using a spectrum analyzer. The I-V characteristics with RF on and off are measured and change between the current at a certain bias point is extracted from the measurements. High frequency losses in the setup are also measured in order to estimate the actual power delivered to the device.

FIGS. 19 and 20 show rectified current as a function of frequency for diodes type A and B, respectively, and at a fixed bias of about 0.35 V (strongest non-linearity point) and RF power of about 4 dBm. The results show that the rectified current decrease as a function of frequency due to the parasitics associated with the diode and due to higher impedance mismatch at higher frequencies. The insets of FIGS. 19 and 20 show the measured rectified current as a function of applied DC bias for diode type A (1 and 2 GHz) and diode type B (5 and 6 GHz), respectively, and fixed incident power of about 4 dBm. For both diodes, the highest measured rectified voltage is near a bias voltage of about 0.35V, which is close to the strongest non-linearity point of the diode. Diodes type B performed better than diode type A, producing much higher rectified current as expected. For example, diodes type B show rectified current of 35 µA at 2 GHz while diodes type A show current of 0.86 µA. For diode B the current remains above about 1 µA over the entire measured frequency range (2-7 GHz).

The measured results show that the SiC/Si based diode has a higher sensitivity (detection). The higher frequency performance of the device is limited by transit time, which is related to the size of the diode and can be further improved by reducing the area of diode. The maximum RF power applied to the diode is limited by source, but it is expected that higher detected current can be achieved at higher power level without breaking down.

FIG. 21 shows measured detected current as a function of input power for diode type II at 3, 5 and 6 GHz with a fixed bias of 0.35 V. From the slope of FIG. 21, it can be verified that the detected voltage response changes linearly with input power over a wide power range (~10 dBm to 4 dBm) for all the measured frequencies and follows the square law detection with slight deviation. The measured result shows that the device has a sensitivity of about 8.4 mA/W for 3 GHZ signal in the measured power range. These preliminary results clearly show that the SiC/Si diodes can be used in the design of microwave circuits. The diode performance can be further improved by lowering series resistance and capacitance. The lower series resistance can be achieved by annealing the contacts in order to reduce the contact resistance, while diodes with smaller area can be used to achieve lower capacitance.

C. SiC/Si Diode Based Frequency Doubler

Frequency multipliers are often used in a variety of applications, such as with frequency synthesizers, transceivers and down converters, and in future applications, such as with 60 GHz broadband wireless systems and 77 GHz automotive radar. Development of such multipliers requires use of high power, wide bandgap devices. Any nonlinear component, such as diodes, varactors or transistors can be used to generate harmonics. Frequency multiplier based on different semiconductor technologies such as GaAs metamorphic HEMT (mHEMT), SiGe BiCMOS and AlGaN/GaN HEMTs have been demonstrated previously. GaN on SiC based HEMTs has led to the highest power levels achieved so far. There is great interest in developing low cost frequency multipliers for commercial MMIC transceivers. Si-based technologies low-cost, high volume commercialization for compact, single-chip transceivers. However, for power applications, the mostly hybrid GaN-based multipliers are still prominent. Here, frequency multipliers based on SiC/Si diodes are provided. For the experimental set-up, the RF signal from a signal generator was supplied to the diode through a directional coupler (HP87300B) and output power at harmonics was measured using a spectrum analyzer.

Frequency multiplication was measured for diodes with no external impedance matching circuits. Second order frequency multiplication was observed over a wide frequency range. The frequency multiplication results are only presented for Type II diodes as Type I diodes have very low output power at a second harmonic due to a higher series resistance. FIG. 22 shows the output power of the second harmonic for a type II diode at fundamental frequencies in the range of 2-6.5 GHz at input power level of −3 dBm. The diode shows an output power −53 dBm for 2×fin=4 GHz, and the highest measured output power remains above −72 dBm for frequencies up to 2×fin=12 GHz. Higher input power levels are not used here due to presence of source harmonics. Considering the large size of the device (70×70 $\mu m^2$), the device provides good performance in the GHz frequency range. The conversion efficiency of the diode decreases at higher frequencies due to transit time loss and impedance mismatch. Device size can be decreased to enhance performance at higher frequencies. FIG. 23 shows the output power of the second harmonic as a function of input power at fundamental frequencies of 2 and 4 GHz. The output power increases linearly with input power over the entire input power range, which demonstrates stable operation of the diode. Also, to achieve higher order harmonics, a power source with lower noise levels can be used to avoid source harmonics or a low pass filter can be used in the measurement set-up. The device should show a linear response at even high power levels as clear from results shown by rectification where high power levels were successfully applied without breakdown of the diode. The diodes were measured multiple times (more than 10 times) to make sure they can withstand cycles of high power levels and the same results were achieved every time. Employing impedance matching techniques and by using bandpass filters to filter higher frequency harmonic content from the source can improve the results. Higher efficiencies can be achieved by supplying more RF input power to the device.

Conclusion

SiC/Si heterojunction diodes are fabricated and tested for RF and microwave circuit applications. SiC is grown directly on a Si substrate using an excimer laser process. This process is performed at a low cost, is simple to implement, and can potentially serve as an alternative to conventional techniques for growing SiC on Si locally for heterogeneous integration of high power microwave circuits directly integrated on a CMOS wafer. The small area diodes for RF characterization were successfully fabricated, showing non-linear I-V characteristics with a small leakage current. Diodes fabricated using a high doped wafer show higher forward current and provide better RF characteristics due to lower series resistance. The best performing diode shows a microwave rectification sensitivity of 8.4 mA/watt (at 3 GHz). The envisioned applications of this rectifier are in high power wireless power transfer. In addition, SiC/Si heterojunction diodes were tested as frequency doublers. Diodes on higher doped wafers show frequency multiplication in the frequency range of from about 4 to about 12 GHz. High frequency high power diodes are demonstrated using a new laser growth technique which can serve as a basic building block for high performance microwave circuits, such as transceivers. Diodes with even smaller areas made using the technique can operate at millimeter wave frequencies and higher. These results clearly attest to the possibility of high-performance SiC-based electronic devices on low-cost, large area Si substrates. This technology can potentially reduce cost, and improve performance for applications associated with high-speed communications, automotive collision avoidance and homeland security weapons detection.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for forming a compound on a substrate, the method comprising:
   depositing a composition comprising a carbon-based polymer onto a surface of the substrate;
   illuminating the composition and the substrate with pulsed energy;
   melting the substrate and decomposing the composition simultaneously; and
   forming the compound on the substrate,
   wherein a first component of the compound is derived from the substrate and a second component of the compound is derived from the composition.

2. The method according to claim 1, wherein the illuminating the composition and the substrate comprises illuminating the composition and the substrate with pulsed energy emitted from an excimer laser, plasma arc melting, or a pulsed energy beam.

3. The method according to claim 2, wherein the pulsed energy is emitted form an excimer laser comprising $Ar_2$, $Kr_2$, $F_2$, $Xe_2$, ArF, KrF, XeBr, XeF, or KrCl.

4. The method according to claim 2, wherein the pulsed energy is emitted from a pulsed linear particle accelerator (linac) selected from the group consisting of pulsed linac ion accelerators, pulsed linac proton accelerators, and pulsed linac electron accelerators.

5. The method according to claim 1, wherein Si is the first component and C is the second component, and the forming the compound on the substrate comprises forming SiC on the Si substrate.

6. The method according to claim 1, wherein the compound and the substrate comprise a heterojunction for an optical device or a photovoltaic device.

7. The method according to claim 1, wherein the depositing the composition onto the surface of the substrate comprises depositing the composition onto a surface of a silicon substrate.

8. The method according to claim 7, wherein the silicon substrate comprises amorphous silicon or crystalline silicon, in solid or powder form.

9. The method according to claim 1, wherein the substrate comprises an unpolished silicon wafer.

10. The method according to claim 1, wherein the depositing a composition onto a surface of a substrate comprises depositing a composition selected from the group consisting of poly(methyl acrylate), poly(methyl methacrylate) (PMMA), polyimides, graphene, graphite, and combinations thereof onto the surface of the substrate.

11. The method according to claim 1, wherein the composition comprises a liquid material and the depositing comprises submerging a silicon substrate into the liquid material to thereby provide a continuous carbon source during multiple pulse illuminations.

12. The method according to claim 1, wherein the illuminating the composition and the substrate comprises illuminating the composition and the substrate with pulsed energy of from about 200 mJ to about 1000 mJ, a pulse duration of from about 10 to about 50 ns, and a pulse repetition rate of from about 1 Hz to about 100 Hz.

13. The method according to claim 1, wherein the depositing, illuminating, melting, and forming are performed at ambient pressure and temperature.

14. The method according to claim 1, further comprising tailoring a band-gap of the compound by increasing the concentration of the second component of the compound such that the first component and second component are present in a first component:second component ratio of from about 1:1 to about 1:0 and adjusting the pulse duration, amplitude power, and/or repetition rate of the pulsed energy.

15. A method for forming SiC on a silicon (Si) substrate, the method comprising:
   depositing polymethyl methacrylate (PMMA) on a surface of the Si substrate by spin coating;
   illuminating the PMMA and Si with an excimer laser that generates from about 1 mJ to about 1000 mJ of energy with pulses of from about 20 ns to about 1000 ns;
   moving the excimer laser relative to the Si substrate and PMMA; and
   forming SiC on the Si substrate.

16. The method according to claim 15, further comprising forming a layer of the SiC on the Si substrate by moving the excimer laser relative to the Si substrate until the entire surface of the Si substrate is covered with SiC.

17. The method according to claim 15, further comprising texturing the SiC formed on the Si substrate by adjusting the pulse rate and focal point of the excimer laser.

18. The method according to claim 5, wherein the method is performed during the manufacture of a photovoltaic or optical device and the method further comprises:
   generating carbon interconnects on the SiC by adjusting a laser profile with a shadow mask such that a power of the laser on its periphery is sufficient to carry out pyrolysis of a carbon source, but low enough that the Si substrate is not melted, and the power of the laser in a center region is sufficiently high so that it melts the surface of the substrate and decomposes the carbon source simultaneously to thereby form SiC.

* * * * *